(12) United States Patent
Chang et al.

(10) Patent No.: US 11,495,697 B2
(45) Date of Patent: Nov. 8, 2022

(54) OPTICAL COMPONENT PACKAGING STRUCTURE

(71) Applicant: PIXART IMAGING INC., Hsin-Chu (TW)

(72) Inventors: Yi-Chang Chang, Hsin-Chu (TW); Yen-Hsin Chen, Hsin-Chu (TW); Chi-Chih Shen, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 2 days.

(21) Appl. No.: 17/113,349

(22) Filed: Dec. 7, 2020

(65) Prior Publication Data

US 2021/0091238 A1 Mar. 25, 2021

Related U.S. Application Data

(60) Continuation of application No. 16/537,284, filed on Aug. 9, 2019, now Pat. No. 10,896,983, which is a (Continued)

(30) Foreign Application Priority Data

Nov. 2, 2016 (TW) .................................. 105135520

(51) Int. Cl.
*H01L 31/0203* (2014.01)
*H01L 27/146* (2006.01)
(Continued)

(52) U.S. Cl.
CPC ............ *H01L 31/0203* (2013.01); *G01J 5/00* (2013.01); *G01J 5/0025* (2013.01); *G01J 5/045* (2013.01);
(Continued)

(58) Field of Classification Search
CPC ........... H01L 31/0203; H01L 31/02363; H01L 31/02164; H01L 31/024; H01L 31/095;
(Continued)

(56) References Cited

U.S. PATENT DOCUMENTS

| 10,896,983 B2 * | 1/2021 | Chang ................. H01L 31/0203 |
| 2016/0163750 A1 * | 6/2016 | Umali ............... H01L 27/14618 257/432 |
| 2016/0282187 A1 * | 9/2016 | Sun ....................... B81B 7/0067 |

* cited by examiner

*Primary Examiner* — Tu-Tu V Ho
(74) *Attorney, Agent, or Firm* — Li & Cai Intellectual Property (USA) Office

(57) ABSTRACT

The instant disclosure provides an optical component packaging structure which includes a far-infrared sensor chip, a first metal layer, a packaging housing and a covering member. The far-infrared sensor chip includes a semiconductor substrate and a semiconductor stack structure. The semiconductor substrate has a first surface, a second surface which is opposite to the first surface, and a cavity. The semiconductor stack structure is disposed on the first surface of the semiconductor substrate, and a part of the semiconductor stack structure is located above the cavity. The first metal layer is disposed on the second surface of the semiconductor substrate, the packaging housing is used to encapsulate the far-infrared sensor chip and expose at least a part of the far-infrared sensor chip, and the covering member is disposed above the semiconductor stack structure.

3 Claims, 22 Drawing Sheets

10k

Related U.S. Application Data continuation of application No. 15/979,708, filed on May 15, 2018, now Pat. No. 10,439,077, which is a division of application No. 15/607,393, filed on May 26, 2017, now Pat. No. 10,002,975.

(51) Int. Cl.
*H01L 31/0236* (2006.01)
*G01J 5/00* (2022.01)
*G01J 5/04* (2006.01)
*G01J 5/20* (2006.01)
H01L 31/0216 (2014.01)
H01L 31/024 (2014.01)
H01L 31/09 (2006.01)

(52) U.S. Cl.
CPC .......... *G01J 5/20* (2013.01); *H01L 27/14625* (2013.01); *H01L 27/14685* (2013.01); *H01L 31/02363* (2013.01); G01J 2005/206 (2013.01); H01L 27/14601 (2013.01); H01L 31/024 (2013.01); H01L 31/02164 (2013.01); H01L 31/095 (2013.01)

(58) Field of Classification Search
CPC ......... H01L 27/14625; H01L 27/14685; H01L 27/14601; G01J 5/00; G01J 5/0025; G01J 5/045; G01J 5/20; G01J 2005/206
USPC ....................................................... 257/432
See application file for complete search history.

OPTICAL COMPONENT PACKAGING STRUCTURE

CROSS REFERENCE TO RELATED APPLICATION

This application is a continuation application of U.S. application Ser. No. 16/537,284 filed on Aug. 9, 2019, and entitled "OPTICAL COMPONENT PACKAGING STRUCTURE", which is a continuation application of U.S. application Ser. No. 15/979,708, filed on May 15, 2018, and entitled "OPTICAL COMPONENT PACKAGING STRUCTURE", which is a divisional application of and claims the priority benefit of a prior application Ser. No. 15/607,393, filed on May 26, 2017, now U.S. Pat. No. 10,002,975, which claims the priority benefits of Taiwan application serial no. 105135520, filed on Nov. 2, 2016. The entirety of each of the above patent applications is hereby incorporated by reference herein and made a part of this specification.

BACKGROUND OF THE INVENTION

1. Field of the Invention

The instant disclosure relates to an optical component packaging structure; in particular, to a thinned optical component packaging structure acting as an infrared shielding and maintaining a constant temperature.

2. Description of Related Art

Nowadays, since lightweighting has become a requirement for the multi-functional digital products on the market, various electronic components with different functions such as sensor chips might be placed collectively into the same space of a product. For example, a multi-functional smart watch may include sensor chips for sensing heart rate, blood pressure, and body temperature, as well as a light source. Hence, the requirements for thinning these electronic components are increased. However, many such electronic components are placed together in a small space, which easily generates noise interferences. In addition, external temperature changes may also affect the stability of these electronic components, which decreases the service life and measurement accuracy of the product. Therefore, overcoming the noise interference problem and reducing the influence of temperature, while at the same time satisfying the thinning requirement, are important issues in the art.

SUMMARY OF THE INVENTION

An optical component packaging structure is provided in the instant disclosure. By balancing the temperature in the optical component packaging structure, the stability of electronic components can be increased. Furthermore, the optical component packaging structure possesses a superior Signal-to-Noise Ratio (SNR) so that the measurement accuracy of sensor chips is increased. At the same time, the packaging structure of the present disclosure has a smaller size than that of the conventional packaging structure. Therefore, the abovementioned problems can be solved. The embodiments adopted by this instant disclosure are described as follows.

To achieve the abovementioned technical problems, one of the embodiments of this instant disclosure provides an optical component packaging structure which includes a far-infrared sensor chip, a first metal layer, a packaging housing and a covering member (eg. a metal covering member). The far-infrared sensor chip includes a semiconductor substrate and a semiconductor stack structure. The semiconductor substrate has a first surface, a second surface which is opposite to the first surface, and a cavity. The semiconductor stack structure is disposed on the first surface of the semiconductor substrate, with the covering member being disposed above the semiconductor stack structure, and a part of the semiconductor stack structure is located above the cavity. The first metal layer is disposed on the second surface of the semiconductor substrate, the packaging housing is used to encapsulate the far-infrared sensor chip, and exposes at least a part of the far-infrared sensor chip.

Another embodiment of the instant disclosure provides an optical component packaging structure which includes a substrate, a far-infrared sensor chip and a covering member. The far-infrared sensor chip is disposed on the substrate and electrically connected to the substrate. The covering member is disposed on the substrate and accommodates the far-infrared sensor chip, and the covering member has an outer surface and an inner surface which face the far-infrared sensor chip, and the inner surface and the substrate include an angle which is substantially in a range of 30° to 80°.

Yet another embodiment of this instant disclosure provides an optical component packaging structure which includes a substrate, a far-infrared sensor chip, a supporting structure, and a metal plate. The far-infrared sensor chip is disposed on the substrate and electrically connected to the substrate. The supporting structure is disposed on the substrate and surrounds the far-infrared sensor chip. The metal plate is disposed on the supporting structure and accommodates the far-infrared sensor chip, and has a metal plate opening exposing the far-infrared sensor chip.

Yet another embodiment of this instant disclosure provides an optical component packaging structure which includes a substrate, a photosensitive member and a light source chip. The substrate has a first concave part and a second concave part. The photosensitive member is disposed in the first concave part and exposed therefrom, and is electrically connected to the substrate. The light source chip is disposed in the second concave part and exposed therefrom, and is electrically connected to the substrate.

The instant disclosure has the benefits that, the stability of electronic components can be increased by balancing the temperature in the optical component packaging structure, such that the optical component packaging structure of the instant disclosure can perform a superior SNR to further increase the measurement accuracy of sensor chips. In addition, since the optical component packaging structure of the instant disclosure has a packaging structure with a smaller size than that of the conventional packaging structure, it can satisfy the thinning requirement of packaging size and reduce production costs.

In order to further appreciate the characteristics and technical contents of the present invention, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Embodiments of an optical component packaging structure disclosed in the instant disclosure are illustrated via specific examples as follows, and people familiar in the art may easily understand the advantages and efficacies of the instant disclosure by disclosure of the specification. The instant disclosure may be implemented or applied by other different specific examples, and each of the details in the specification may be applied based on different views and may be modified and changed under the spirit of the instant disclosure. The figures in the instant disclosure are not depicted according to actual size and do not reflect the actual size of the relevant structure. The following embodiments further illustrate related technologies of the instant disclosure in detail, but the scope of the instant disclosure is not limited herein.

In this specification, the terminology such as first, second, or third is used for describing various elements or information, but the elements or information should not be restricted by these terminologies. These terminologies are used for distinguishing between an element and another element, or a piece of information and another piece of information. In addition, the terminology used in this specification can include any one of or a plurality of combinations of related items depending upon the situations.

First Embodiment

Figure 1:
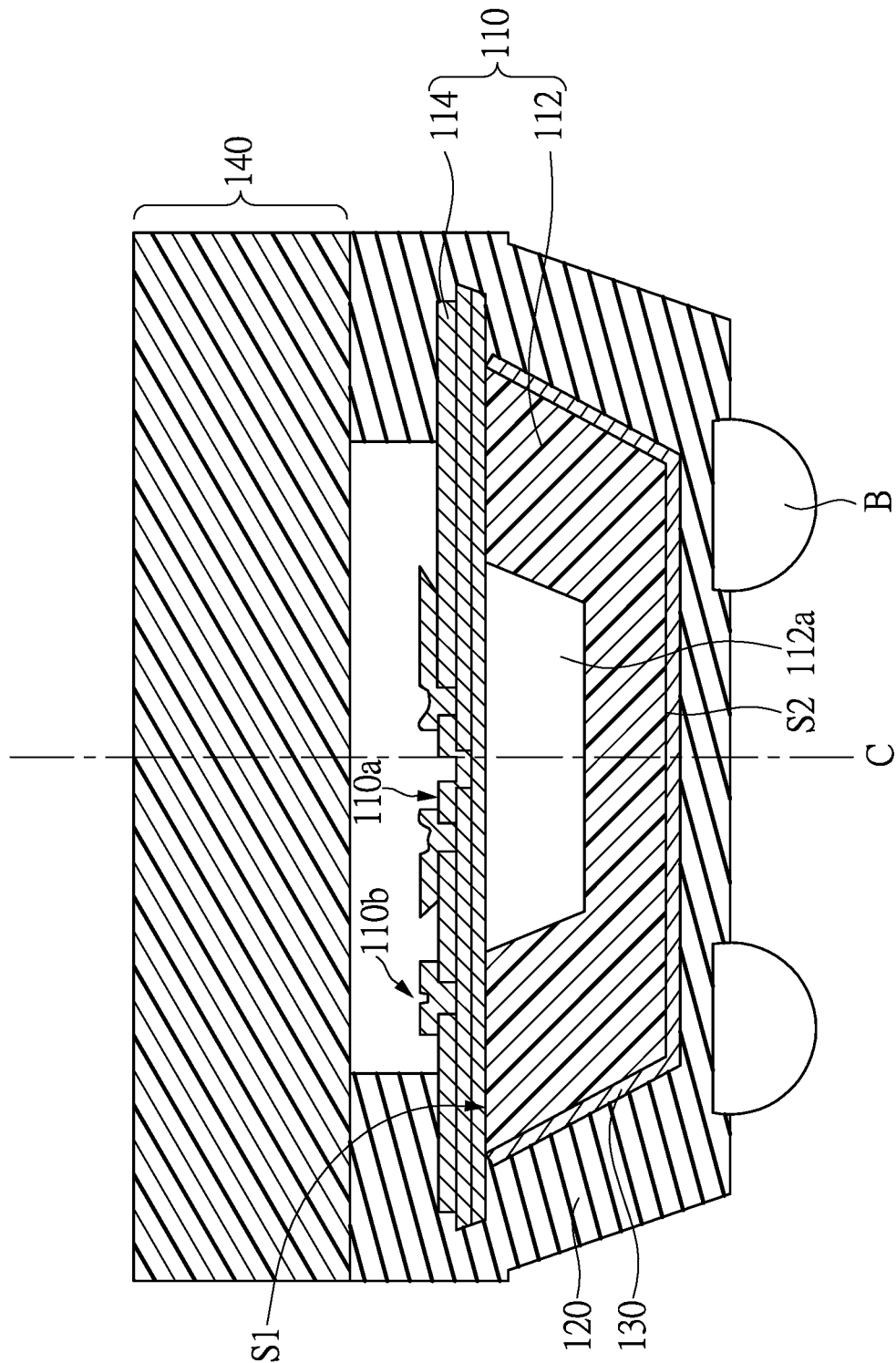
FIG. 1 shows a schematic diagram of an optical component packaging structure of a first embodiment in the instant disclosure.

Referring to FIG. 1, a schematic diagram of an optical component packaging structure of a first embodiment in the instant disclosure is shown. As illustrated, the first embodiment of the instant disclosure provides an optical component packaging structure 10 which includes a far-infrared sensor chip 10, a packaging housing 120, a first metal layer 130, and a covering member 140. The far-infrared sensor chip 110 includes a semiconductor substrate 112 and a semiconductor stack structure 114. The semiconductor substrate 112 has a first surface S1, a second surface S2 which is opposite to the first surface S1, and a cavity 112a. In this embodiment, a silicon substrate is used as an example of the semiconductor substrate 112 for illustration, but in other embodiments, the semiconductor substrate 112 may also adopt other suitable substrates to match the semiconductor stack structure 114. Besides, the semiconductor stack structure 114 is disposed on the first surface S1 of the semiconductor substrate 112, and a part of the semiconductor stack structure 114 is located above the cavity 112a, as shown in FIG. 1.

In detail, the semiconductor stack structure 114 can be stacked up by a P-type semiconductor material, an N-type semiconductor material, and an insulating material. In which, the insulating material is sandwiched between the P-type semiconductor material and the N-type semiconductor material. The semiconductor stack structure 114 has a hot junction 110a and a cold junction 110b, and the hot junction 110a of the far-infrared sensor chip 110 is located above the cavity 112a where the P-type semiconductor material and the N-type semiconductor material contacted each other. Relatively, the cold junction 110b of the far-infrared sensor chip 110 is distant to the hot junction 110a, the latter of which is closer to a center C of the cavity 112a.

Further referring to FIG. 1, the first metal layer 130 is disposed on the second surface S2 of the semiconductor substrate 112, the packaging housing 120 is used to encapsulate the far-infrared sensor chip 110 and exposes at least a part of the far-infrared sensor chip 110, and the covering member 140 is disposed above the semiconductor stack structure 114. Specifically, the first metal layer 130 of the optical component packaging structure 10 has a thickness which is in a range of 0.1 μm (micrometer) to 30 μm. In this embodiment, the first metal layer 130 is used to stop other stray lights from entering into the far-infrared sensor chip 110, so as to upgrade the sensitivity of the far-infrared sensor chip 110. In more detail, since a far infrared light and a near infrared light both have the ability to pass through certain materials, after the first metal layer 130 with the thickness ranging from 0.1 μm to 30 μm is disposed on the second surface S2 of the semiconductor substrate 112, a Signal-to-Noise Ratio (SNR) of the far-infrared sensor chip 110 can be significantly improved.

In addition, the cavity 112a of the semiconductor substrate 112 of the optical component packaging structure 10 has a height (not labeled) which is in a range of 10 μm to 1000 μm, and the cavity 112a can be filled of air or be in a vacuum state, as shown in FIG. 1. In this embodiment, the cavity 112a is mainly used to block the heat of the hot junction 110a to prevent the heat from dissipating to the outside too quickly. Otherwise, detected thermal voltage signals will be affected. In other words, the cavity 112a of this embodiment is mainly used to prevent too much of the heat of the semiconductor stack structure 114 from dissipating to the outside.

Furthermore, the covering member 140 may be made of a silicon material to block other visible lights or infrared lights from entering into the optical component packaging structure 10 from the front side thereof. That is the covering member 140 of this embodiment is mainly used to allow the far-infrared light to pass therethrough, and to filter away other lights so as to upgrade the sensitivity of the far-infrared sensor chip 110.

In summary, this embodiment uses a metal having high thermal conductivity properties and uses the first metal layer 130 with an optimal thickness to shield against other stray lights. For example, the near infrared light and the far infrared light (that is, the infrared lights other than the measured object) pass through the optical component packaging structure 10. Furthermore, this embodiment cooperatively uses the cavity 112a which is designed to have a height ranging from 10 μm to 1000 μm, so that the heat generated among elements in the structure can avoid being influenced by each other. Thus, an optimal shielding effect for blocking the infrared lights (especially the far infrared light having a wavelength ranging from 15 μm to 1000 μm) and an optimal thermal conductive effect are achieved. Moreover, because the optical component packaging structure 10 of this embodiment of the instant disclosure has a superior thermal conductive effect, the temperature of the optical component packaging structure 10 can be immediately modulated to reach a constant temperature, so as to maintain the stability of the product. In addition, since the first metal layer 130 of this embodiment of the instant disclosure has a very thin thickness, which is in a range of 0.1 μm to 30 μm, a lightweighting effect can be achieved.

Second Embodiment

Figure 2:
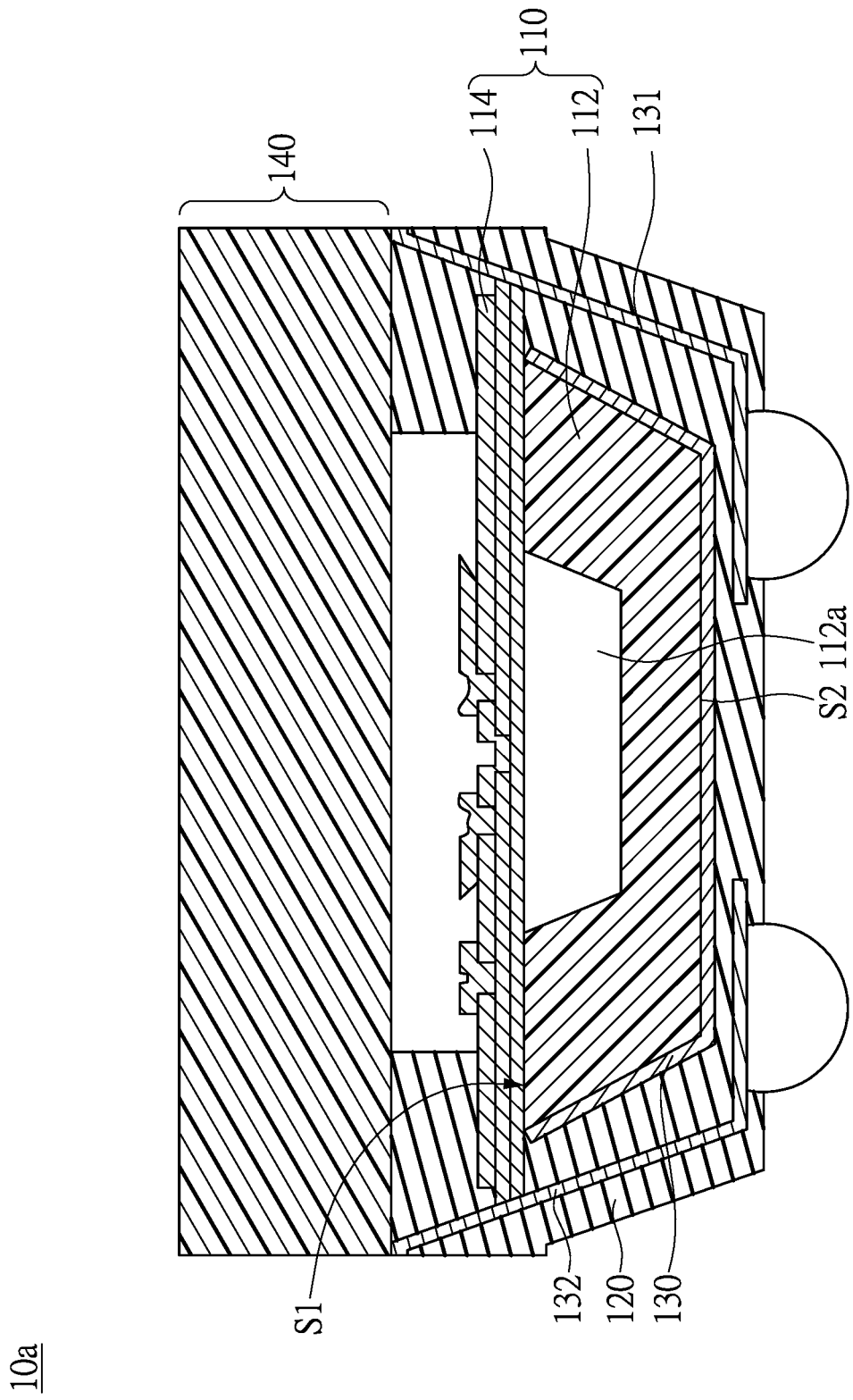
FIG. 2 shows a schematic diagram of an optical component packaging structure of a second embodiment in the instant disclosure.

FIG. 2 shows a schematic diagram of an optical component packaging structure of a second embodiment in the instant disclosure. Referring to FIG. 2, an optical component packaging structure 10a of the second embodiment in the instant disclosure is similar to the optical component packaging structure 10 of the first embodiment in the instant disclosure, except that the optical component packaging structure 10a of the second embodiment includes a packaging housing 120 which has a plurality of metal leads 131, 132 located therein, and a part of the plurality of metal leads 131, 132 electrically connected to the far-infrared sensor chip 110 (e.g., solder ball).

Via the arrangement of the plurality of metal leads 131, 132 of the second embodiment, the shielding efficacy of infrared light can be improved, and the temperature conduction velocity can be increased to reach a constant temperature in the optical component packaging structure 10a quicker.

Third Embodiment

Figure 3:
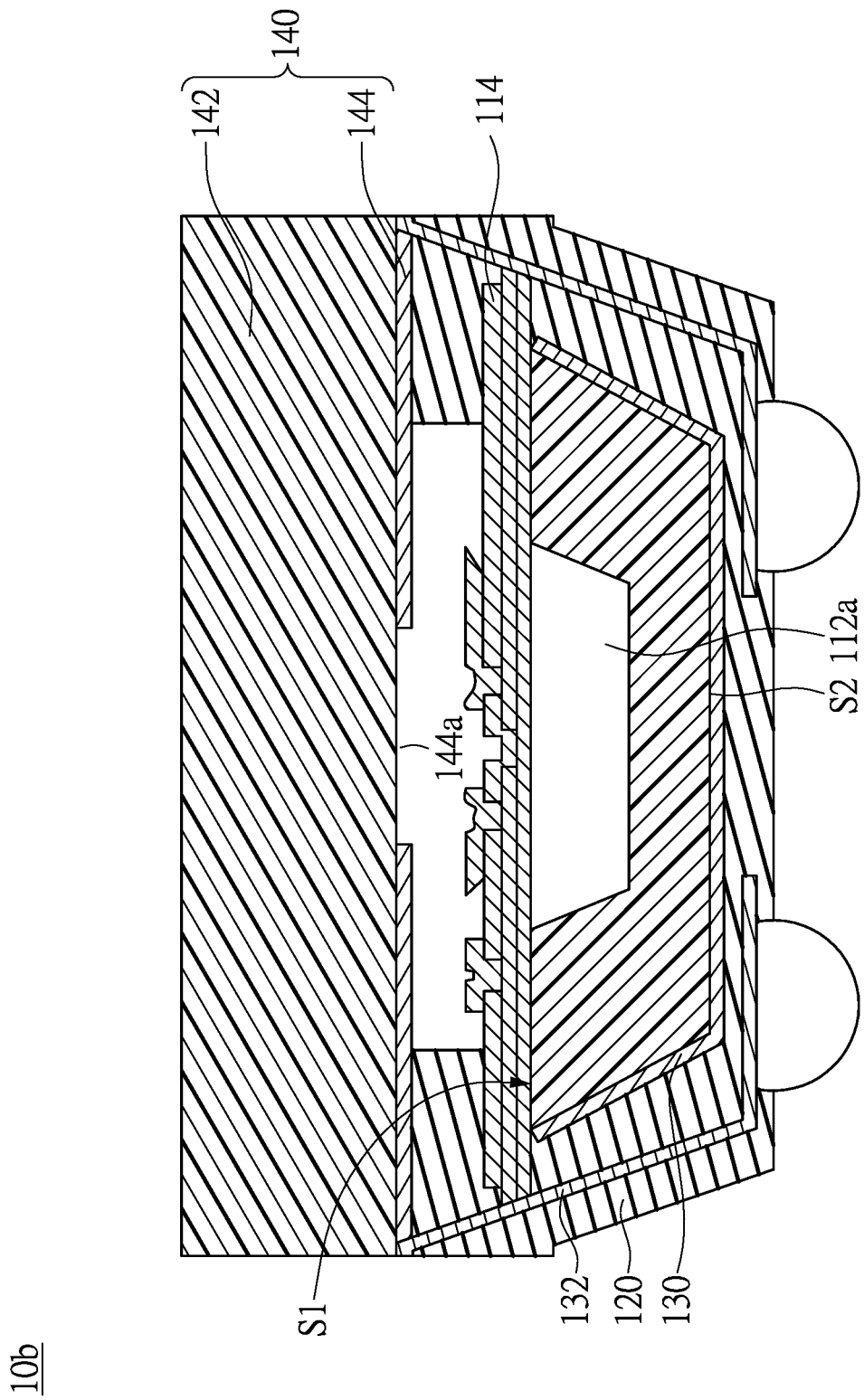
FIG. 3 shows a schematic diagram of an optical component packaging structure of a third embodiment in the instant disclosure.

FIG. 3 shows a schematic diagram of an optical component packaging structure of a third embodiment in the instant disclosure. Referring to FIG. 3, an optical component packaging structure 10b of the third embodiment in the instant disclosure is similar to the optical component packaging structure 10 of the first embodiment in the instant disclosure, except that the optical component packaging structure 10b of the third embodiment includes a covering member 140 which has a light transmission substrate (eg. the light transmission member) 142 and a second metal layer 144, the second metal layer 144 being disposed on the light transmission substrate 142 and having a first opening portion 144a exposing the light transmission substrate 142, and the second metal layer 144 being located between the light transmission substrate 142 and the semiconductor stack structure 114.

In this embodiment, the light transmission substrate 142 may be made of a material such as glass or plastic, or may be other substrates having better light transmittance. The second metal layer 144 has a thickness which is in a range of 0.1 μm to 30 μm. The covering member 140 further includes an anti-reflective coating (AR Coating) (not shown). Since light passes through material such as glass, which attenuates the penetrating power of light, the transmission rate after the light passes through the material is less than 100%. Therefore, the AR Coating may be disposed for increasing the light transmission rate.

Via the optical component packaging structure 10b of this embodiment, the shielding efficacy of infrared light can be improved, and the temperature conduction velocity can be increased to reach a constant temperature in the optical component packaging structure 10b quicker.

Fourth Embodiment

Figure 4:
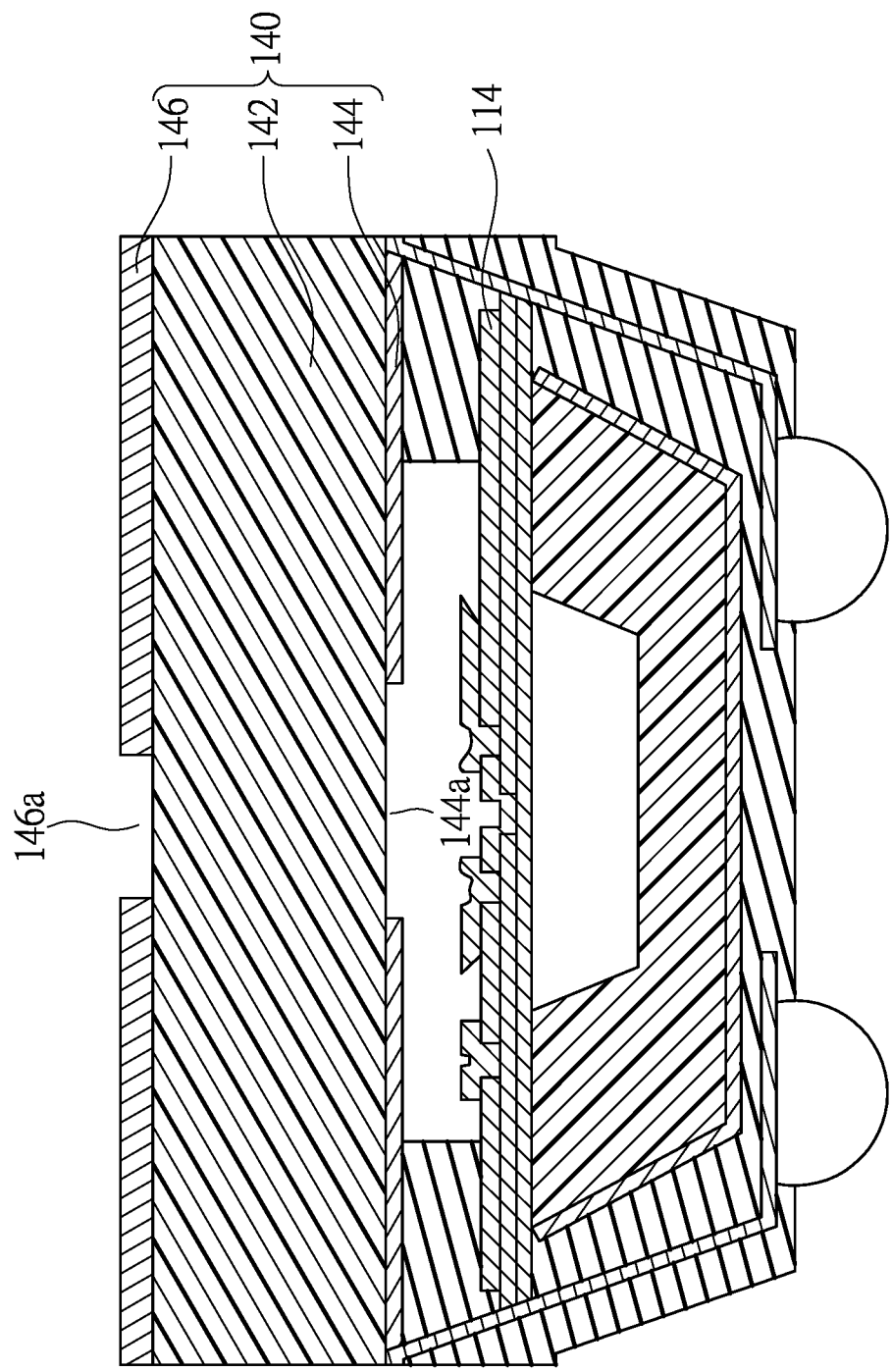
FIG. 4 shows a schematic diagram of an optical component packaging structure of a fourth embodiment in the instant disclosure.

FIG. 4 shows a schematic diagram of an optical component packaging structure of a fourth embodiment in the instant disclosure. Referring to FIG. 4, an optical component packaging structure 10c of the fourth embodiment in the instant disclosure is similar to the optical component packaging structure 10b of the third embodiment in the instant disclosure, except that the optical component packaging structure 10c of the fourth embodiment includes the covering member 140 which further has a third metal layer 146 disposed on the light transmission substrate 142 and has a second opening portion 146a exposing the light transmission substrate 142, the light transmission substrate 142 being located between the second metal layer 144 and the third metal layer 146, and the first opening portion 144a and the second opening portion 146a being opposite to each other.

In this embodiment, the third metal layer 146 has a thickness which is in a range of 0.1 μm to 30 μm. Via the optical component packaging structure 10c of this embodiment, the shielding efficacy of infrared light can be improved, and the temperature conduction velocity can be increased to reach a constant temperature in the optical component packaging structure 10b quicker.

Fifth Embodiment

Figure 5:
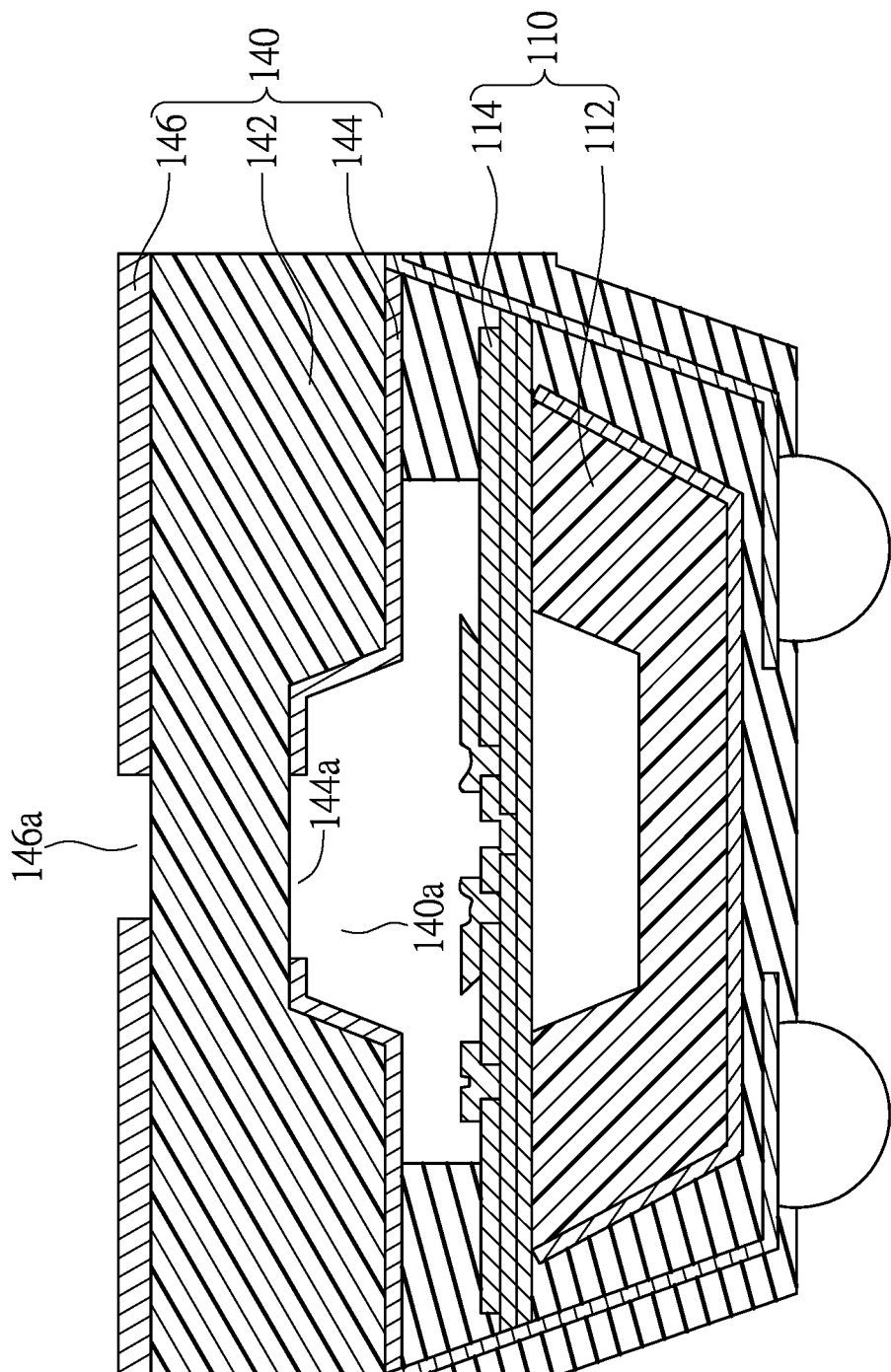
FIG. 5 shows a schematic diagram of an optical component packaging structure of a fifth embodiment in the instant disclosure.

FIG. 5 shows a schematic diagram of an optical component packaging structure of a fifth embodiment in the instant disclosure. Referring to FIG. 5, an optical component packaging structure 10d of the fifth embodiment in the instant disclosure is similar to the optical component packaging structure 10 of the first embodiment in the instant disclosure, except that the optical component packaging structure 10d of the fifth embodiment includes the covering member 140 which further has an indented portion 140a, a notch of the indented portion 140a facing toward the far-infrared sensor chip 110. In such manner, a distance is generated between the covering member 140 and the far-infrared sensor chip 110. Since the thermal conductivity of air is inferior, using this feature, the air in a space generate by the distance can stop any excess heat (e.g., the heat generated among components) from conducting to the far-infrared sensor chip 110, so as to avoid influencing the measurement result of the far-infrared sensor chip 110.

Sixth Embodiment

Figure 6:
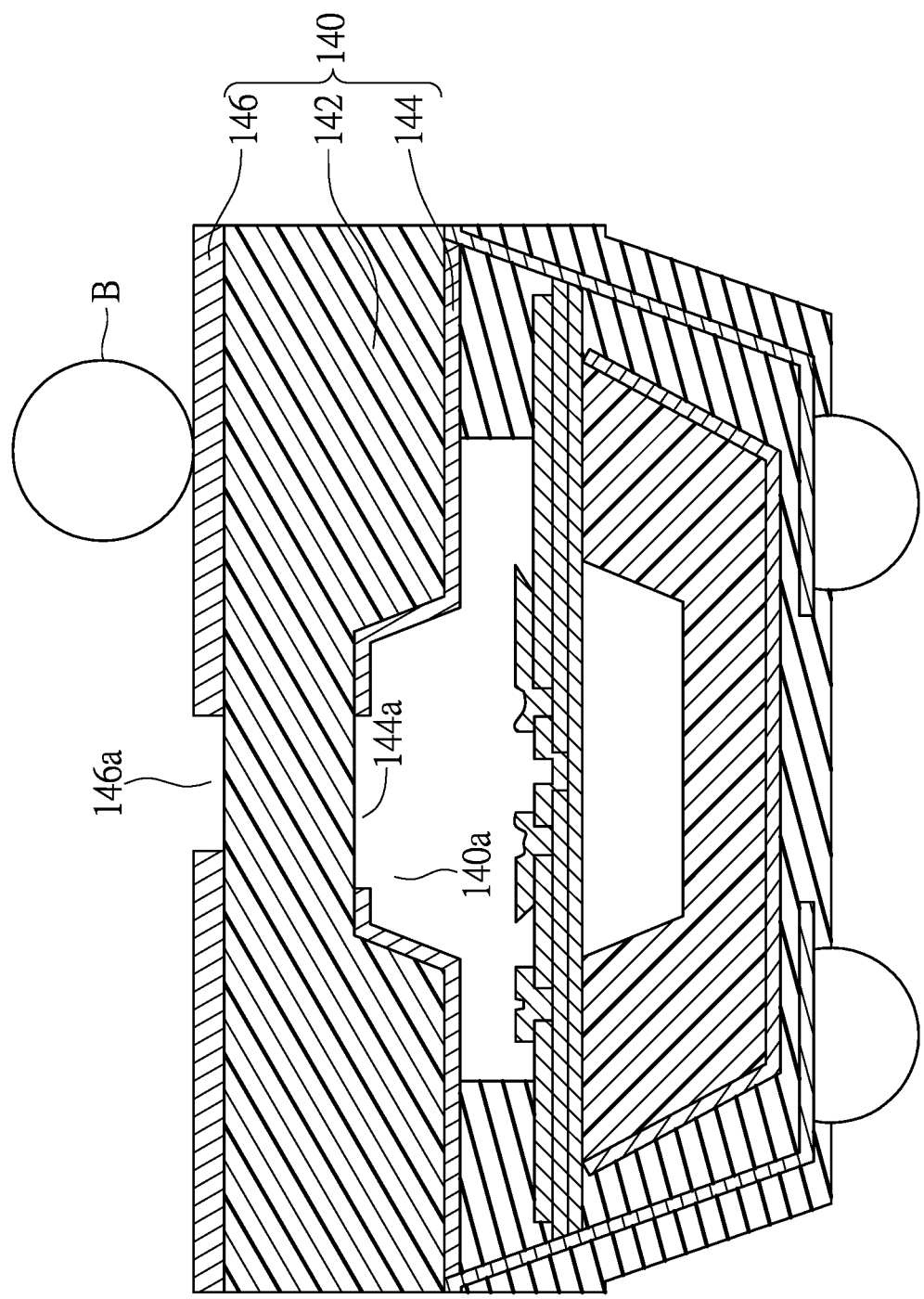
FIG. 6 shows a schematic diagram of an optical component packaging structure of a sixth embodiment in the instant disclosure.

FIG. 6 shows a schematic diagram of an optical component packaging structure of a sixth embodiment in the instant disclosure. Referring to FIG. 6, an optical component packaging structure 10e of the sixth embodiment in the instant disclosure is similar to the optical component packaging structure 10d of the fifth embodiment in the instant disclosure, except that the optical component packaging structure 10e of the sixth embodiment includes the covering member 140 which further has a solder ball B being disposed thereon and being opposite to the indented portion 140a for electrically connecting to other required components.

Seventh Embodiment

Figure 7:
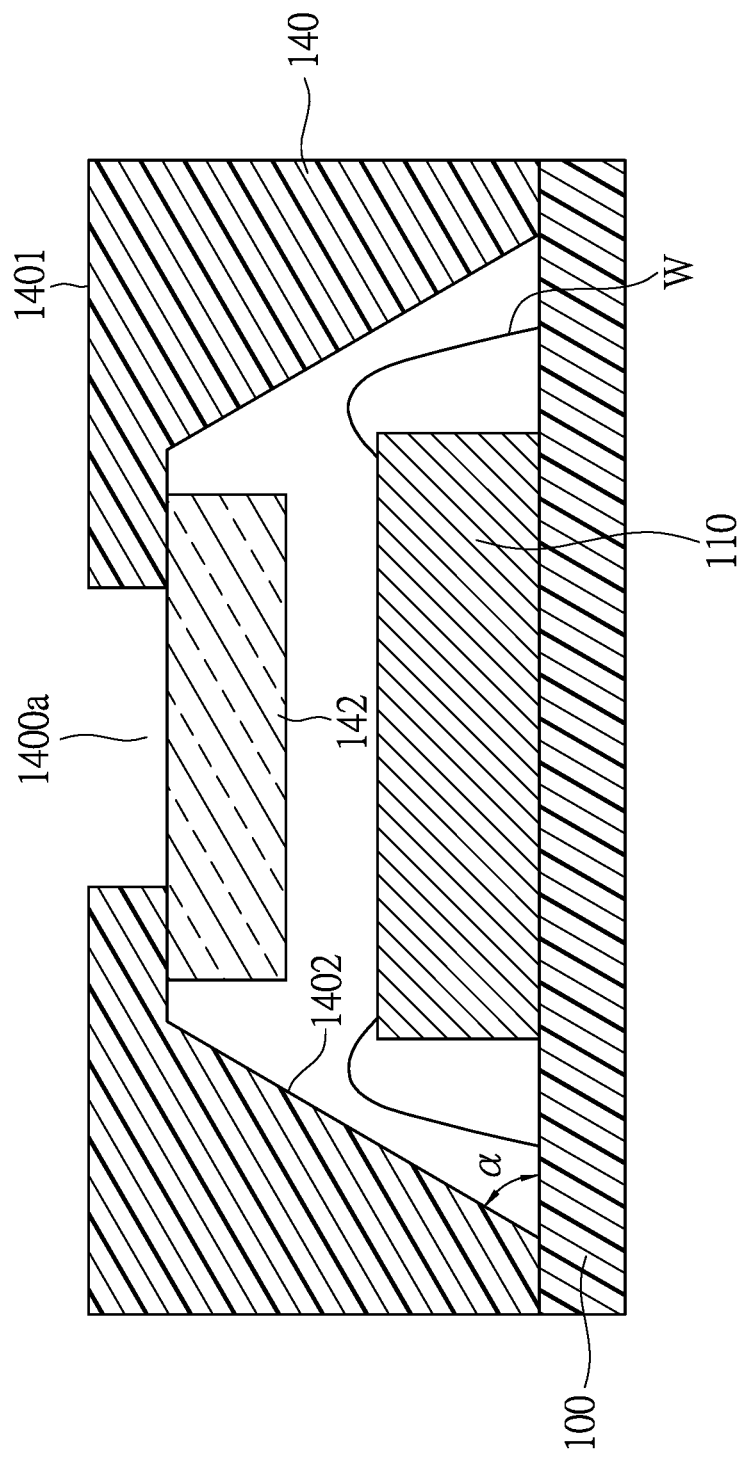
FIG. 7 shows a schematic diagram of an optical component packaging structure of a seventh embodiment in the instant disclosure.

FIG. 7 shows a schematic diagram of an optical component packaging structure of a seventh embodiment in the instant disclosure. Referring to FIG. 7, the seventh embodiment of the instant disclosure provides an optical component packaging structure 10f which includes a substrate 100, a far-infrared sensor chip 110 and a covering member 140. The far-infrared sensor chip 110 is disposed on the substrate 100 and electrically connected to (e.g., a conducting wire W) the substrate 110. The covering member 140 is disposed on the substrate 100 and accommodates the far-infrared sensor chip 110, and the covering member 140 has an outer surface 1401 and an inner surface 1402 which faces the far-infrared sensor chip 110. The inner surface 1402 and the substrate 100 include an angle α which is substantially in a range of 30° to 80°.

Specifically, in this embodiment, the far-infrared sensor chip 110 of the optical component packaging structure 10f is selected from a group consisting of thermopile, pyroelectric element and thermosensitive element such as bolometer. The covering member 140 has an opening 1400a exposing the far-infrared sensor chip 110, and further includes a light transmission substrate (eg. the light transmission member) 142 disposed at the opening 1400a. In addition, the covering member 140 is made of a silicon material to block other visible lights or infrared lights entering into the optical component packaging structure 10f from the front side thereof. That is, the covering member 140 of this embodiment is mainly used to allow the far-infrared light to pass therethrough, and to filter other lights to increase the sensitivity of the far-infrared sensor chip 110. The light transmission substrate 142 may be made of a translucent material such as glass or plastic, or may be other substrates which have a better light transmittance. The covering member 140 is made of a light-tight material which is selected from a group consisting of plastic material and silicon material, so as to block visible lights.

The inner surface 1402 and the substrate 100 include an angle α ranging from 30° to 80° therebetween, and via this design of this embodiment, molecules can be deposited more intensively during sputtering in the manufacturing process. Therefore, the sputtering operation can be conducted more conveniently, so that the problems of uneven sputtering of vertical covers and operational inconvenience in the prior art can be overcome. It should be noted that, the sputtering is used only as an illustrative example in this embodiment, but the present disclosure is not limited thereto.

In this embodiment, the angle α preferably ranges from 45° to 75°, and more preferably ranges from 55° to 70°, and particularly preferably ranges from 60° to 65°.

Eighth Embodiment

Figure 8:
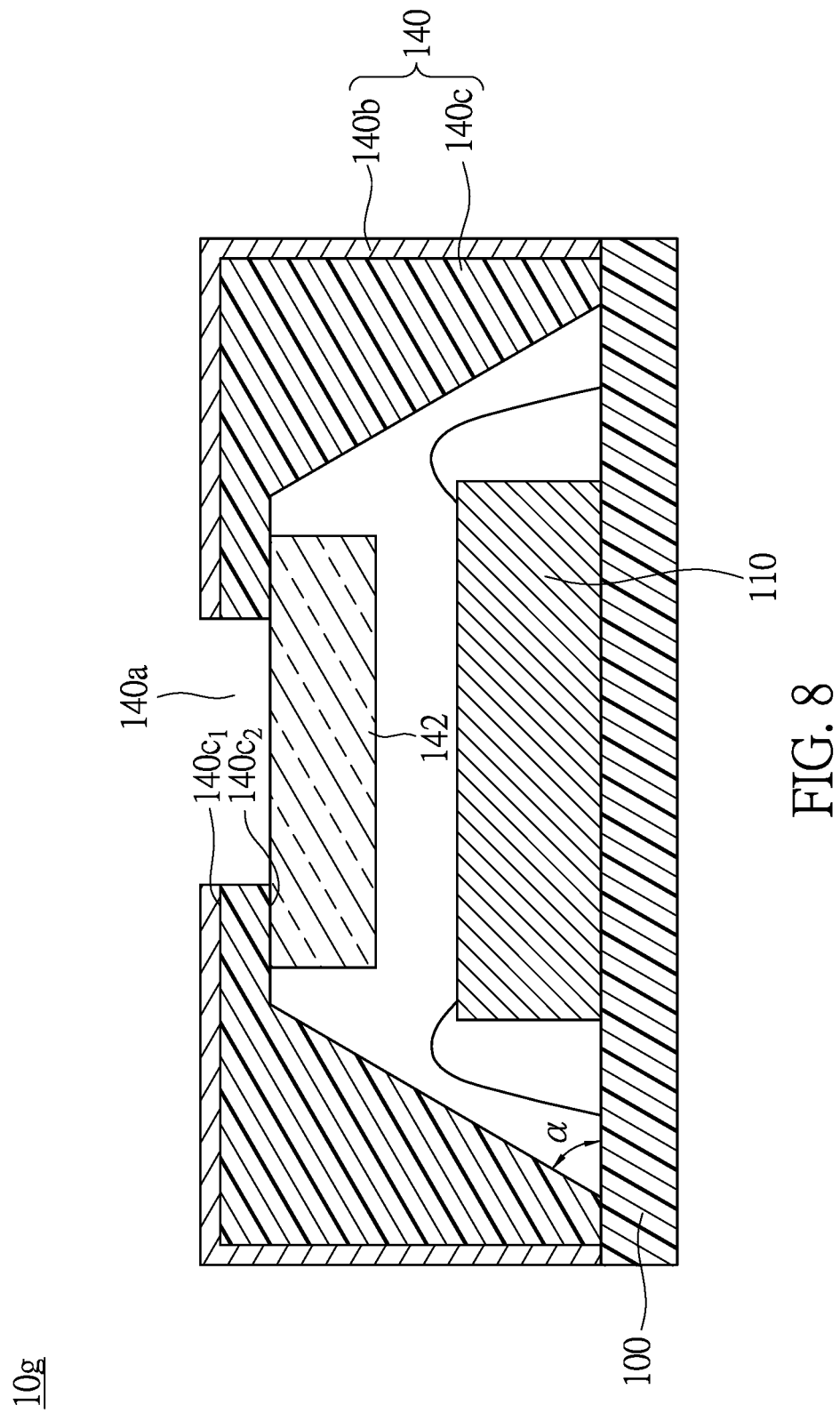
FIG. 8 shows a schematic diagram of an optical component packaging structure of an eighth embodiment in the instant disclosure.

FIG. 8 shows a schematic diagram of an optical component packaging structure of an eighth embodiment in the instant disclosure. Referring to FIG. 8, an optical component packaging structure 10g of the eighth embodiment in the instant disclosure is similar to the optical component packaging structure 10f of the seventh embodiment in the instant disclosure, except that the optical component packaging structure 10g of the eighth embodiment includes a covering member 140 which further has a metal layer portion 140b and a covering cap 140c. The covering cap 140c is light-tight, is selected from a group consisting of plastic material and silicon material, and has a first outer surface $140c_1$ and a first inner surface $140c_2$ opposite to the first outer surface $140c_1$. The first inner surface $140c_2$ faces the far-infrared sensor chip 110.

Specifically, the metal layer portion 140b of the covering member 140 has a thickness which is in a range of 0.1 μm to 30 μm, and is disposed on the first outer surface $140c_1$ of the covering cap 140c. In this embodiment, the covering cap 140c made of a light-tight material can be used to block visible lights. The metal layer portion 140b has a thickness ranging from 0.1 μm to 30 μm and is disposed on the first outer surface $140c_1$ of the covering cap 140c, so that the outside visible light and the infrared light passing from lateral sides, which influence the far-infrared sensor chip 110, can be stopped. In this manner, the far-infrared sensor chip 110 can accurately receive the infrared light (especially the infrared light having a wavelength ranging from 15 μm to 1000 μm) being emitted from the subject located at the front side of the far-infrared sensor chip 110, so as to improve the SNR and the overall performance of the optical component packaging structure 10g. Furthermore, since the metal layer portion 140b has the thickness ranging from 0.1 μm to 30 μm, it can effectively prevent any unnecessary infrared lights from passing into the optical component packaging structure 10g of this embodiment, so that both the shielding efficacy of blocking the infrared lights and the thermal conductive effect can be optimized. Thus, the temperature in the optical component packaging structure 10g can be immediately adjusted to be constant to maintain the stability of the product. Moreover, because the metal layer portion 140*b* of this embodiment has a very thin thickness ranging from 0.1 µm to 30 µm, a lightweighting effect can be achieved.

Ninth Embodiment

Figure 9:
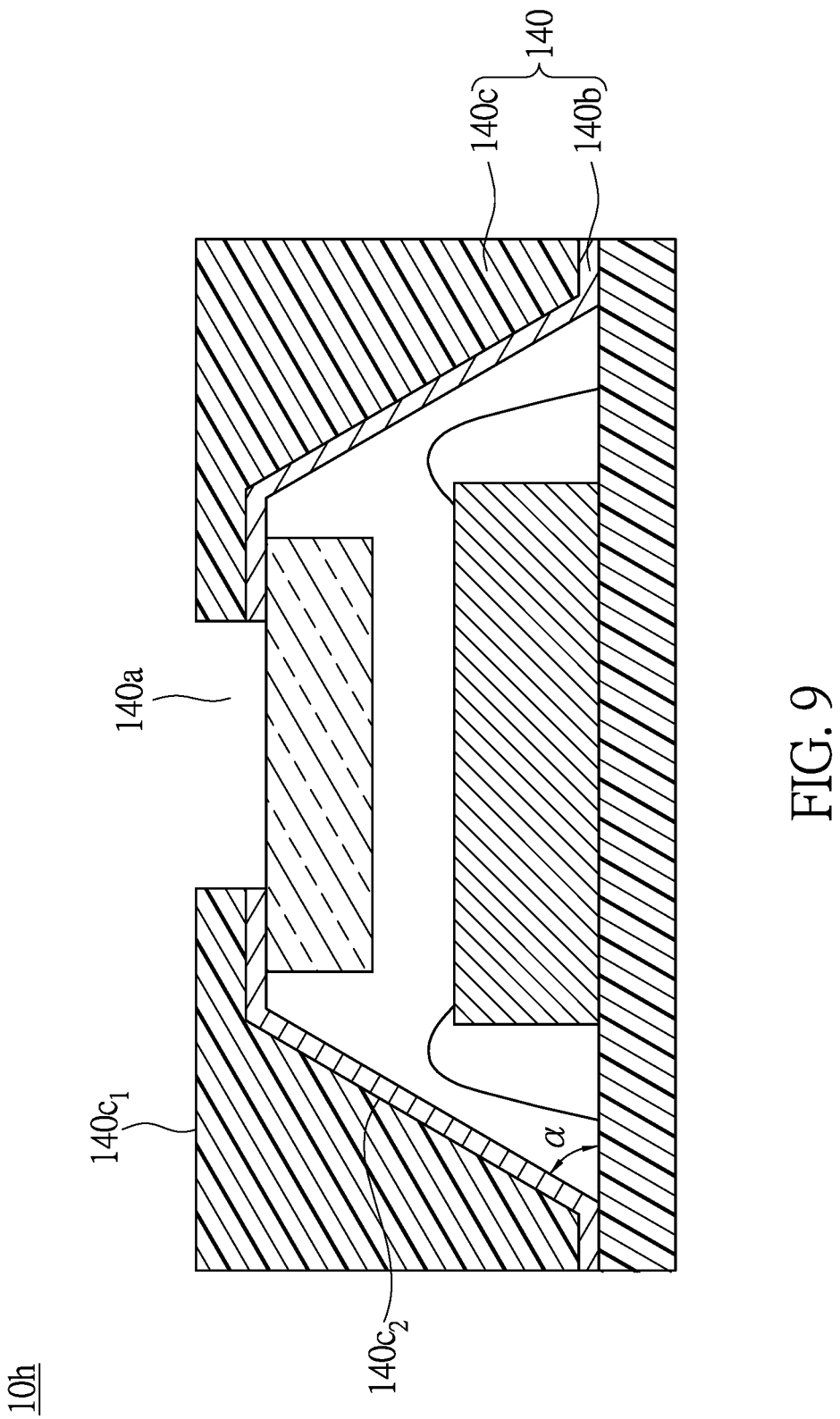
FIG. 9 shows a schematic diagram of an optical component packaging structure of a ninth embodiment in the instant disclosure.

FIG. 9 shows a schematic diagram of an optical component packaging structure of a ninth embodiment in the instant disclosure. Referring to FIG. 9, an optical component packaging structure 10*h* of the ninth embodiment in the instant disclosure is similar to the optical component packaging structure 10*g* of the eighth embodiment in the instant disclosure, except that in this embodiment, the metal layer portion 140*b* of the covering member 140 is disposed on the first inner surface 140$c_2$ of the covering cap 140*c*.

In the ninth embodiment, the design of disposing the metal layer portion 140*b* on the first inner surface 140$c_2$ of the covering cap 140*c* has an effect identical to that of the eighth embodiment, and thus will not be reiterated herein.

Tenth Embodiment

Figure 10:
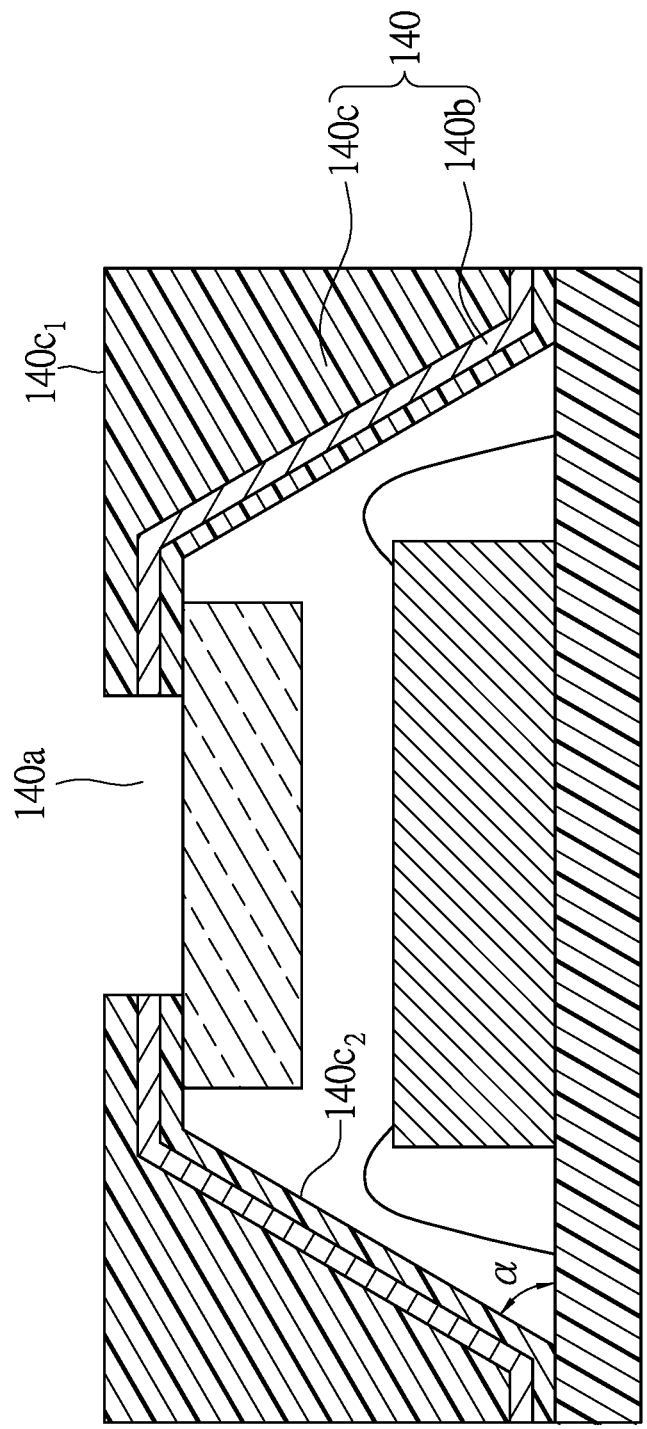
FIG. 10 shows a schematic diagram of an optical component packaging structure of a tenth embodiment in the instant disclosure.

FIG. 10 shows a schematic diagram of an optical component packaging structure of a tenth embodiment in the instant disclosure. Referring to FIG. 10, an optical component packaging structure 10*i* of the tenth embodiment in the instant disclosure is similar to the optical component packaging structure 10*g* of the eighth embodiment in the instant disclosure, except that in this embodiment, the metal layer portion 140*b* of the covering member 140 is disposed in the covering cap 140*c*.

In the tenth embodiment, the design of disposing the metal layer portion 140*b* in the covering cap 140*c* has an effect identical to that of the eighth embodiment, and thus will not be reiterated herein.

Eleventh Embodiment

Figure 11:
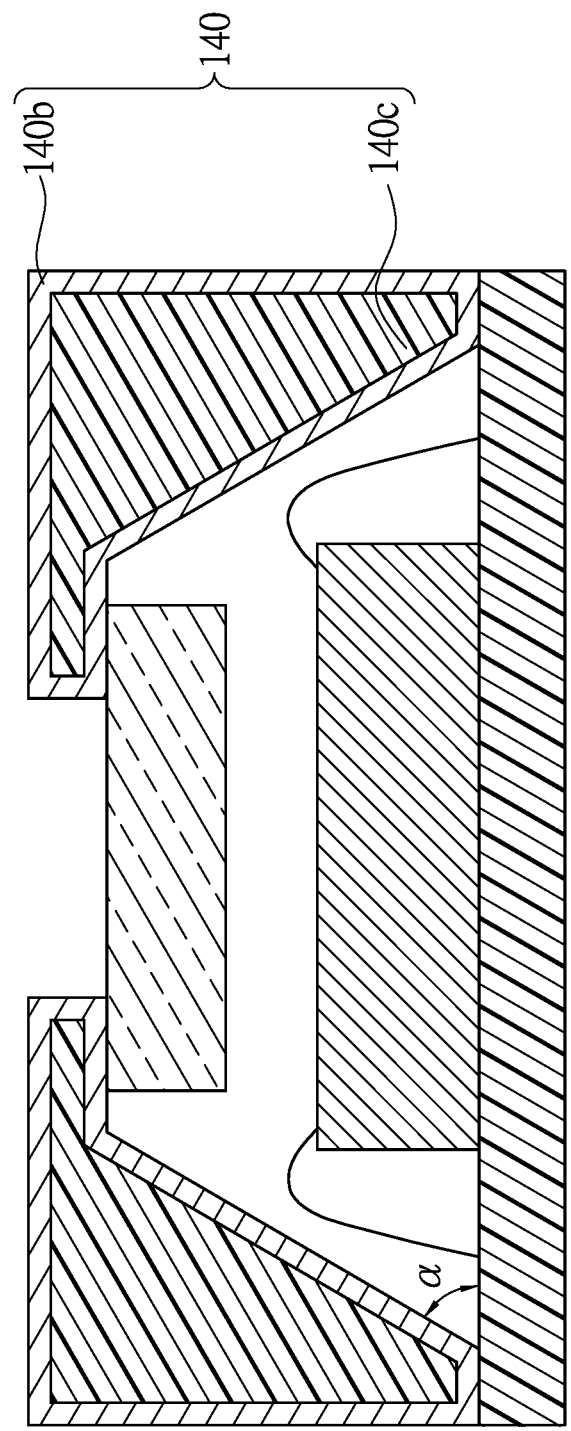
FIG. 11 shows a schematic diagram of an optical component packaging structure of an eleventh embodiment in the instant disclosure.

FIG. 11 shows a schematic diagram of an optical component packaging structure of an eleventh embodiment in the instant disclosure. Referring to FIG. 11, an optical component packaging structure 10*j* of the eleventh embodiment in the instant disclosure is similar to the optical component packaging structure 10*g* of the eighth embodiment in the instant disclosure, except that in this embodiment, the metal layer portion 140*b* of the covering member 140 is cladded on the covering cap 140*c*.

In the eleventh embodiment, the design of the metal layer portion 140*b* of the covering member 140 cladding the covering cap 140*c* can improve the shielding efficacy of infrared light and increase the temperature conduction velocity, so that a constant temperature in the optical component packaging structure 10*j* can be more quickly reached.

Twelfth Embodiment

Figure 12:
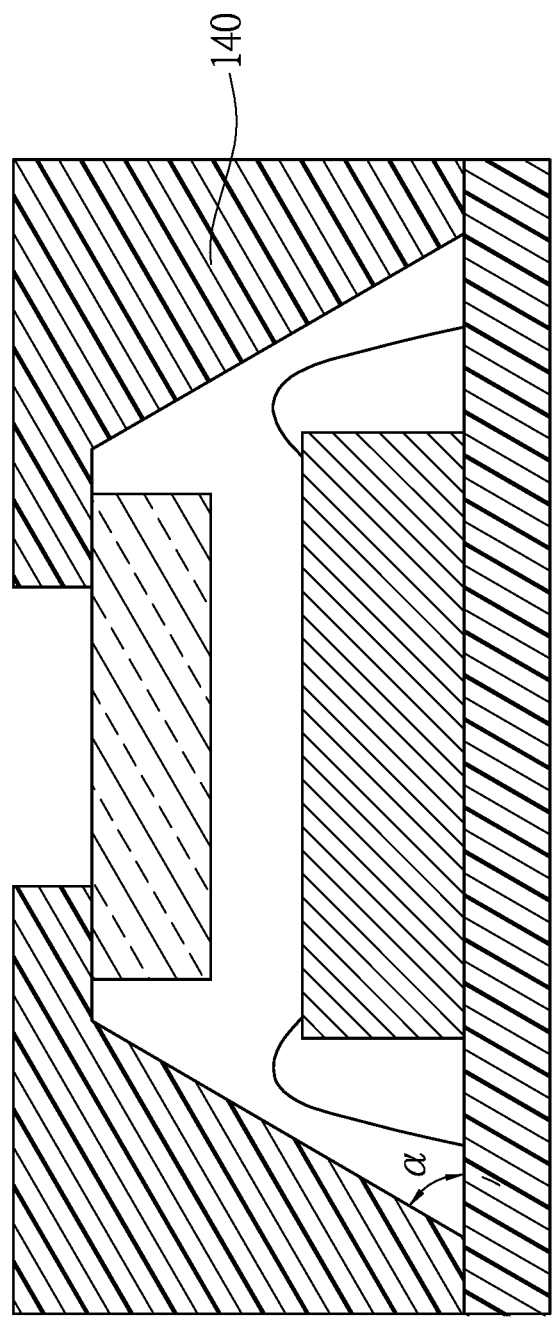
FIG. 12 shows a schematic diagram of an optical component packaging structure of a twelfth embodiment in the instant disclosure.

FIG. 12 shows a schematic diagram of an optical component packaging structure of a twelfth embodiment in the instant disclosure. Referring to FIG. 12, an optical component packaging structure 10*k* of the twelfth embodiment in the instant disclosure is similar to the optical component packaging structure 10*g* of the eighth embodiment in the instant disclosure, except that in this embodiment, the covering member (eg. The metal covering member) 140 is made of a metal material. In such manner, the shielding efficacy of infrared light and the temperature conduction velocity can be increased, so that a constant temperature in the optical component packaging structure 10*k* can be more quickly reached.

Thirteenth Embodiment

Figure 13:
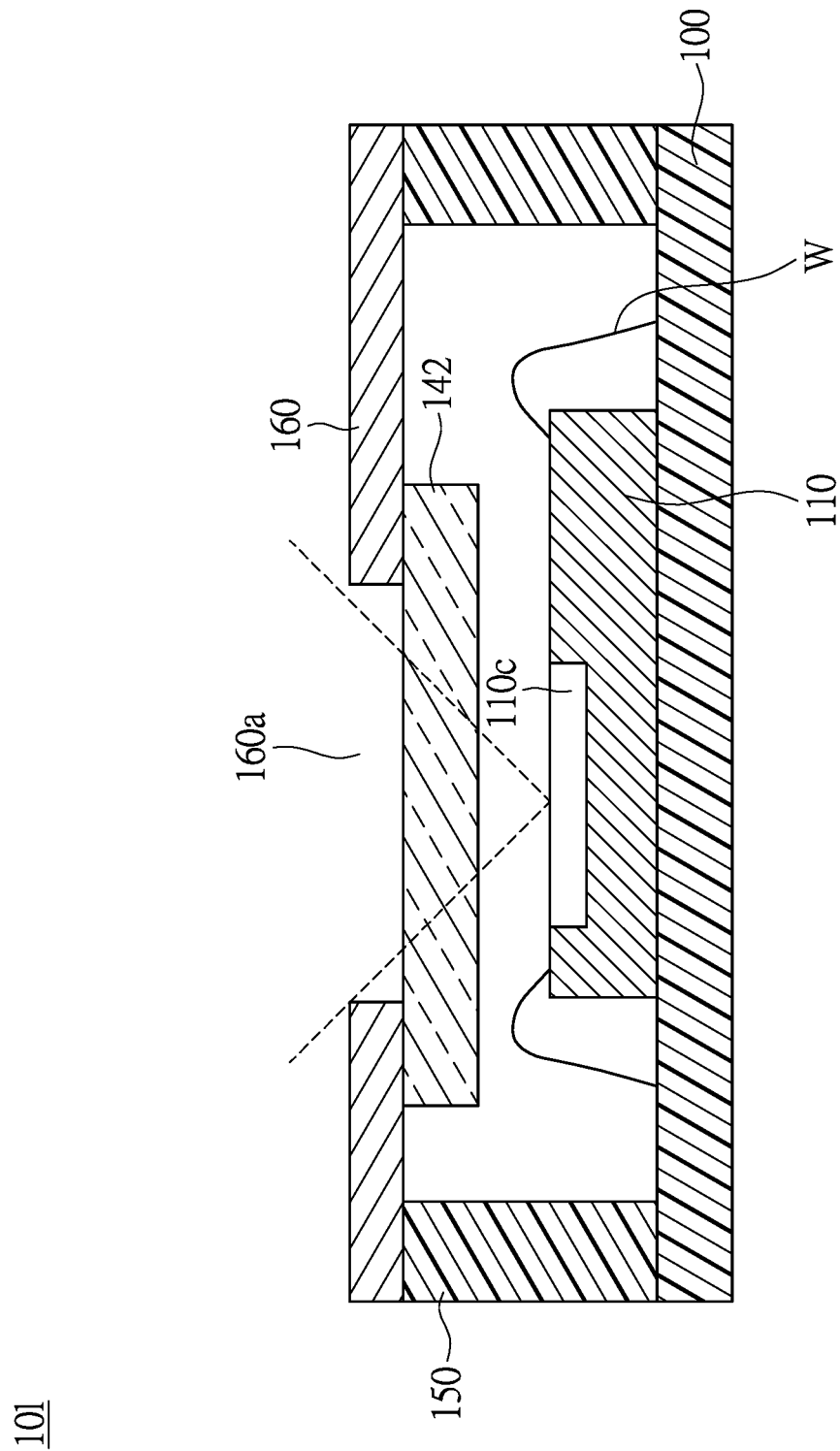
FIG. 13 shows a schematic diagram of an optical component packaging structure of a thirteenth embodiment in the instant disclosure.

FIG. 13 shows a schematic diagram of an optical component packaging structure of a thirteenth embodiment in the instant disclosure. Referring to FIG. 13, the thirteenth embodiment provides an optical component packaging structure 101 which includes a substrate 100, a far-infrared sensor chip 110, a supporting structure 150, and a metal plate 160. The far-infrared sensor chip 110 is disposed on the substrate 100 and electrically connected to the substrate 100 (e.g., conducting wire W). The supporting structure 150 is disposed on the substrate 100 and surrounds the far-infrared sensor chip 110. The metal plate 160 is disposed on the supporting structure 150, accommodates the far-infrared sensor chip 110, and has a metal plate opening 160*a* exposing the far-infrared sensor chip 110.

Specifically, the far-infrared sensor chip 110 has a slit 110*c* with a view range. The metal plate 160 has a thickness which is in a range of 0.01 µm to 0.5 µm. The supporting structure 150 is light-tight and is selected from a group consisting of plastic material and silicon material. In addition, in this embodiment, the optical component packaging structure 101 further includes a light transmission substrate 142 which may be made of a translucent material such as glass or plastic, or may be other substrates which have a better light transmittance.

By virtue of the following designs in this embodiment, the metal plate 160 of the optical component packaging structure 101 is disposed on the supporting structure 150 to accommodate the far-infrared sensor chip 110, and has a thickness ranging from 0.01 µm to 0.5 µm that can stop the outside visible light and the infrared light passing from lateral sides from influencing the far-infrared sensor chip 110. The far-infrared sensor chip 110 can accurately receive the infrared light emitted from the subject located at the front side of the far-infrared sensor chip 110, so as to improve the SNR and the overall performance of the optical component packaging structure 101. Furthermore, since the metal plate 160 of this embodiment directly replaces the cover of the prior art, it is unnecessary for a metal shielding structure to be disposed on a periphery of a packaging structure, so that the manufacturing cost can be deceased and a lightweighting effect can be achieved.

Fourteenth Embodiment

Figure 14:
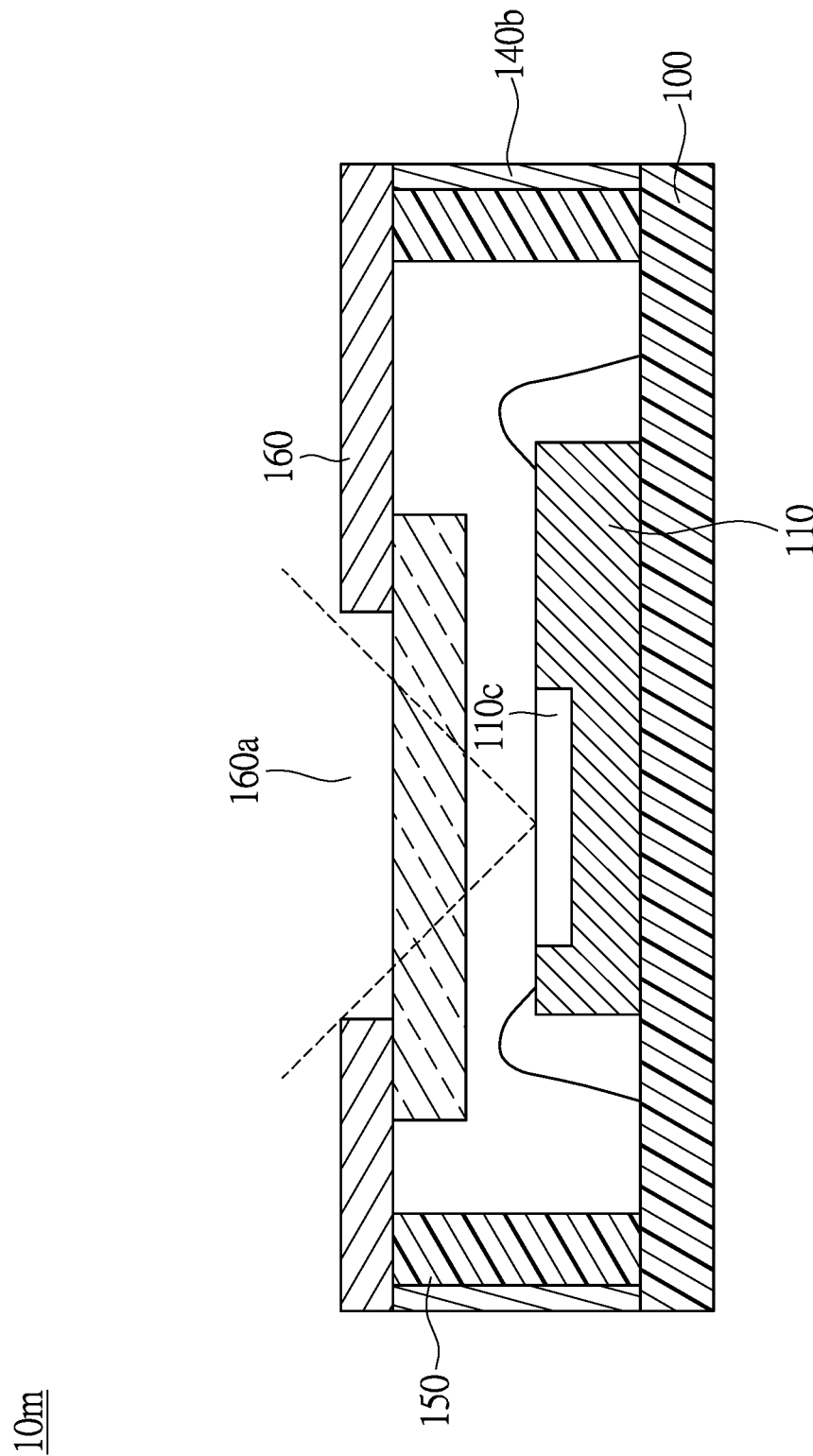
FIG. 14 shows a schematic diagram of an optical component packaging structure of a fourteenth embodiment in the instant disclosure.

FIG. 14 shows a schematic diagram of an optical component packaging structure of a fourteenth embodiment in the instant disclosure. Referring to FIG. 14, an optical component packaging structure 10*m* of the fourteenth embodiment in the instant disclosure is similar to the optical component packaging structure 101 of the thirteenth embodiment in the instant disclosure, except that the optical component packaging structure 10*m* of the fourteenth embodiment has the metal layer portion 140*b* with a thickness in a range of 0.01 µm to 10 µm, and is disposed at an outer side of the supporting structure 150.

In this embodiment, via the design of disposing the metal layer portion 140*b* with the thickness ranging from 0.01 µm to 10 µm at the outer side of the supporting structure 150, besides the abovementioned effects in the thirteenth embodiment, it can also effectively block unnecessary infrared lights passing into the optical component packaging structure 10*m* of this embodiment, and both the shielding efficacy of blocking the infrared lights and the thermal conductive effect can be optimized. Thus, the temperature in the optical component packaging structure 10*m* can be immediately adjusted to be constant to maintain the stability of the product.

Fifteenth Embodiment

Figure 15:
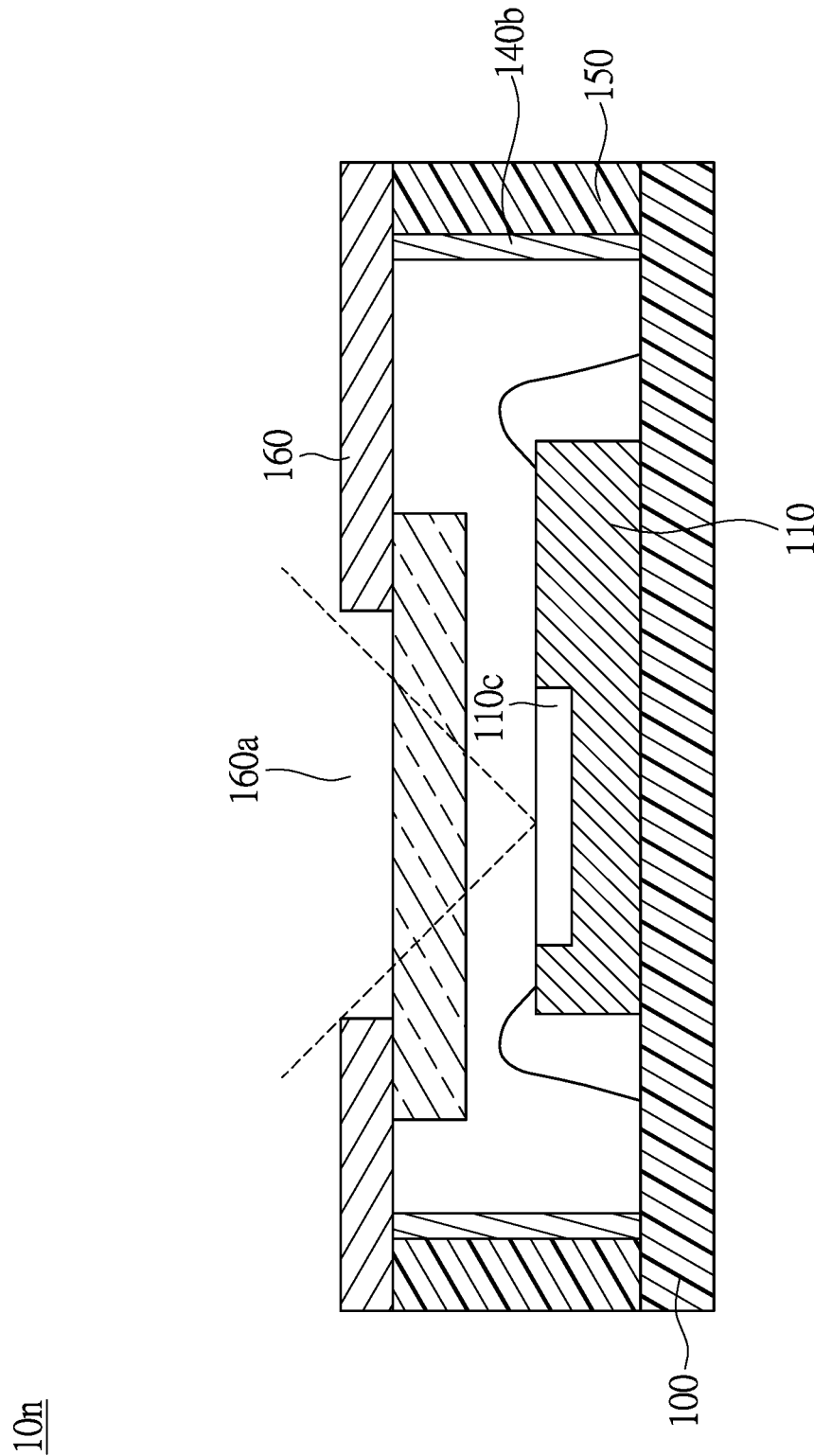
FIG. 15 shows a schematic diagram of an optical component packaging structure of a fifteenth embodiment in the instant disclosure.

FIG. 15 shows a schematic diagram of an optical component packaging structure of a fifteenth embodiment in the instant disclosure. Referring to FIG. 15, an optical component packaging structure 10*n* of the fifteenth embodiment in the instant disclosure is similar to the optical component packaging structure 10*m* of the fourteenth embodiment in the instant disclosure, except that in this embodiment, the metal layer portion 140*b* of the supporting structure 150 is disposed at an inner side of the supporting structure 150, and the inner side is opposite to the outer side and faces the far-infrared sensor chip 110.

In the fifteenth embodiment, the design of disposing the metal layer portion 140*b* at the inner side of the supporting structure 150 has an effect identical to that of the fourteenth embodiment, and thus is not reiterated herein.

Sixteenth Embodiment

Figure 16A:
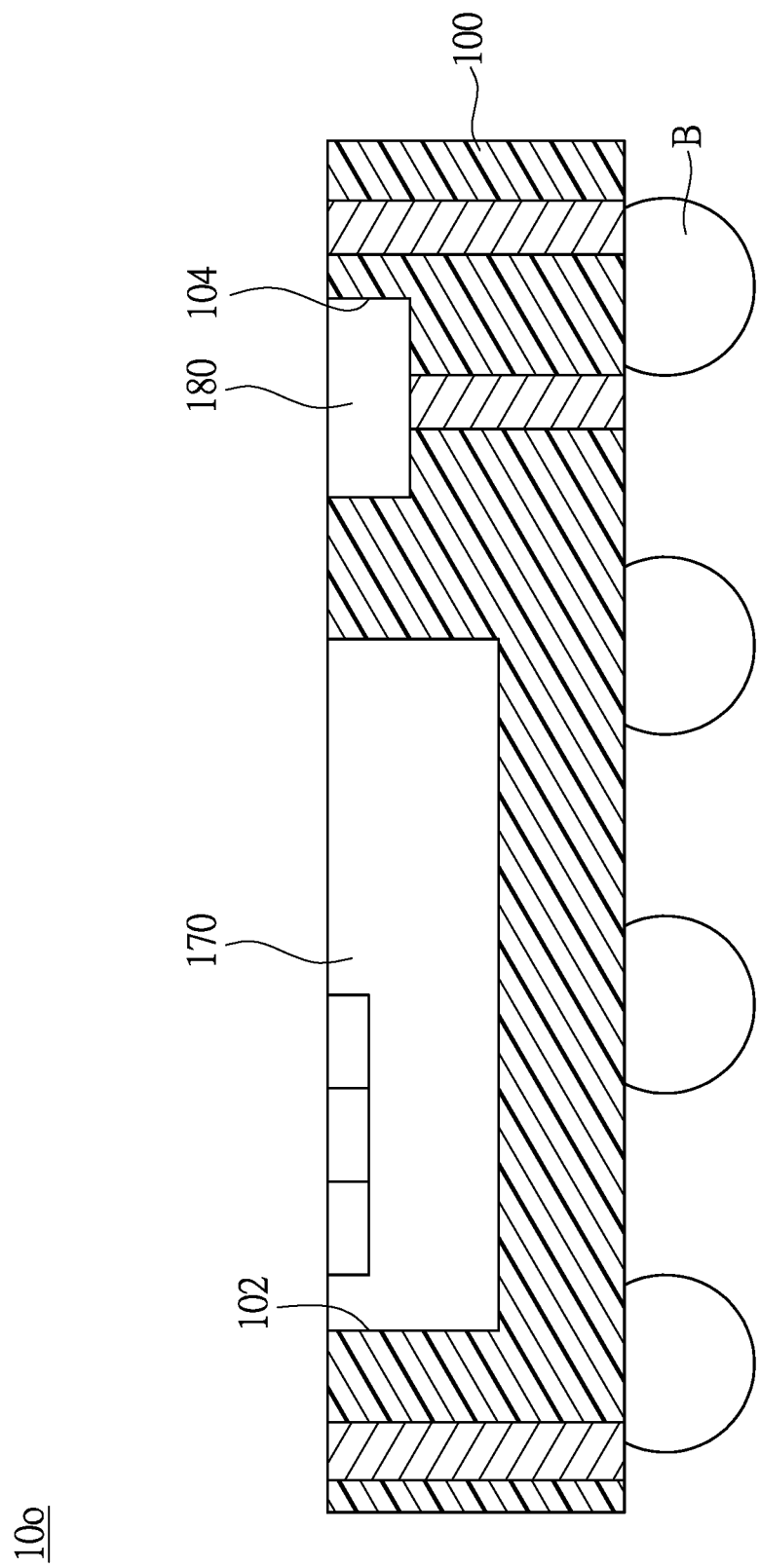
FIG. 16A shows a side view of an optical component packaging structure of a sixteenth embodiment in the instant disclosure.
Figure 16B:
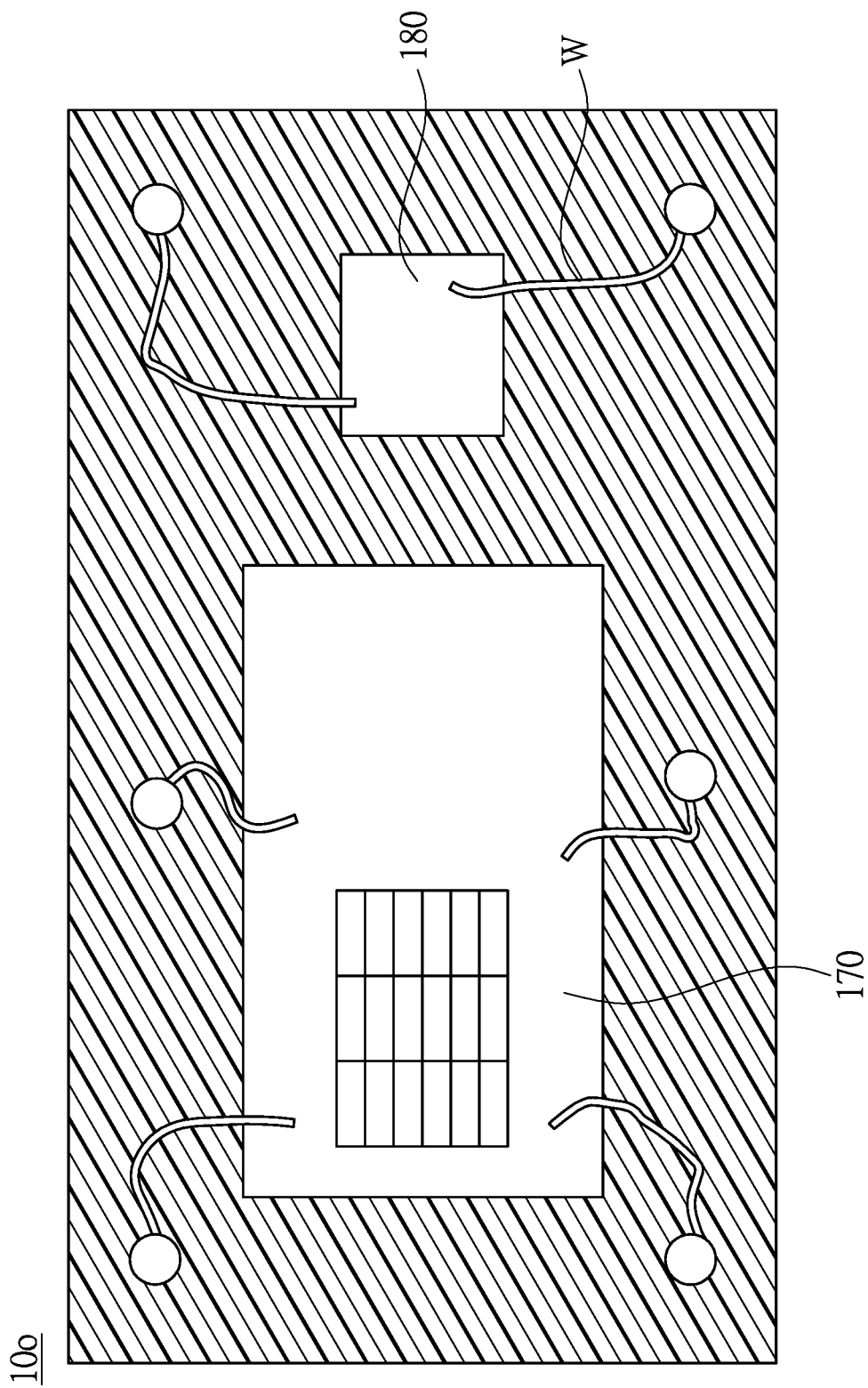
FIG. 16B shows a top view of an optical component packaging structure of a sixteenth embodiment in the instant disclosure.
Figure 16C:
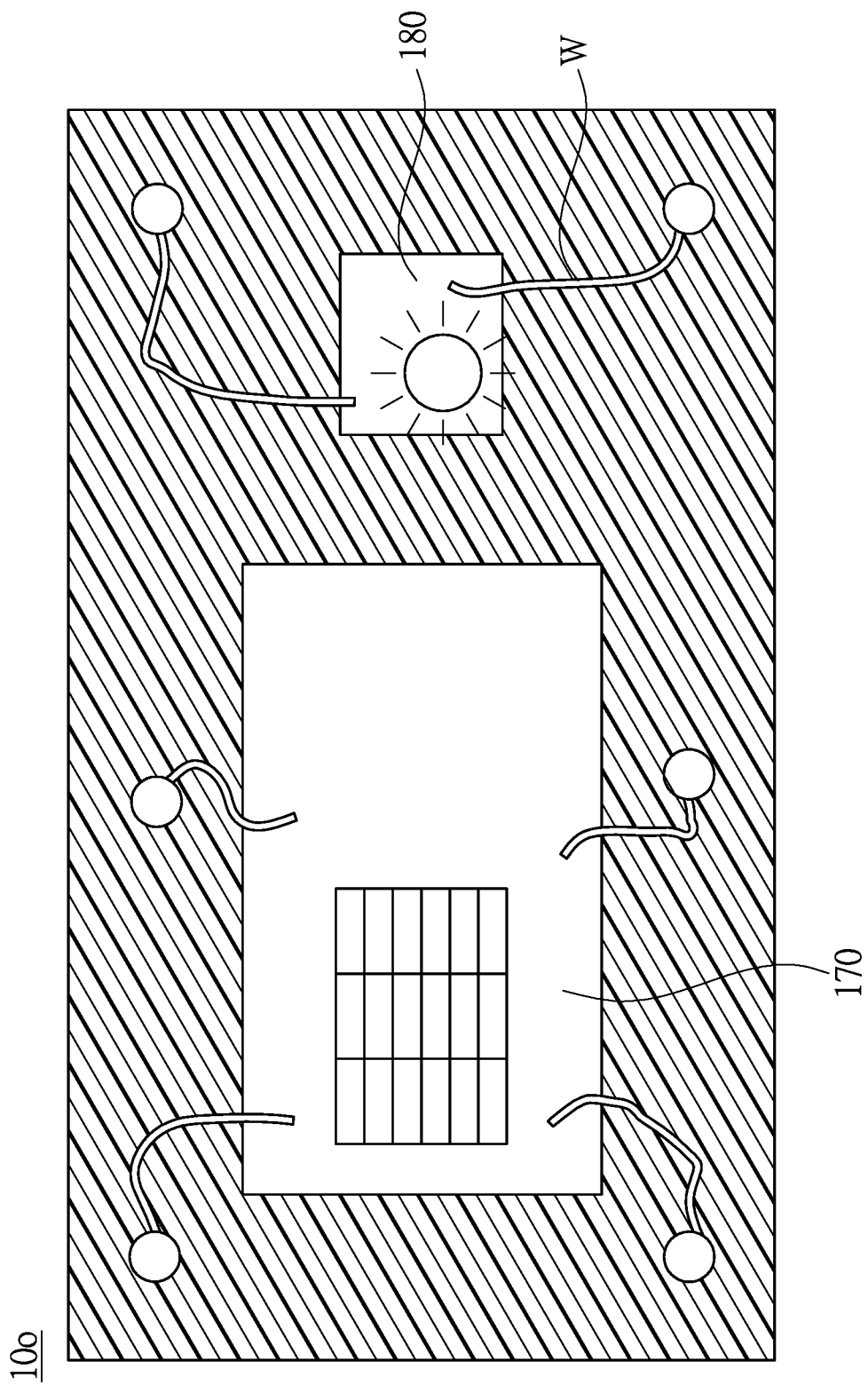
FIG. 16C shows a schematic diagram of an optical component packaging structure of the sixteenth embodiment in a used state.

Referring to FIG. 16A to FIG. 16C, FIG. 16A shows a side view of an optical component packaging structure of a sixteenth embodiment in the instant disclosure, FIG. 16B shows a top view of an optical component packaging structure of the sixteenth embodiment in the instant disclosure, and FIG. 16C shows a schematic diagram of an optical component packaging structure of the sixteenth embodiment in a used state.

As illustrated, the sixteenth embodiment of this instant disclosure provides an optical component packaging structure 10*o* which includes a substrate 100, a photosensitive member 170 and a light source chip 180. The substrate 100 has a first concave part 102 and a second concave part 104. The photosensitive member 170 is disposed in the first concave part 102 and is exposed therefrom, and is electrically connected to the substrate 100. The light source chip 180 is disposed in the second concave part 104 and exposed therefrom, and is electrically connected to the substrate 100.

Specifically, the substrate 100 is made of a light-tight material such as a plastic material or a silicon material which is used to block visible lights, and a thickness of the substrate 100 is 0.3 mm or less. The photosensitive member 170 and the light source chip 180 respectively have a thickness which is in a range of 50 μm to 80 μm, and a total thickness of the optical component packaging structure 10*o* is 0.3 mm or less. The light source chip 180 is selected from a group consisting of laser diode and light emitting diode. The light source chip 180 in FIG. 16C is shown as being a laser diode.

In the packaging structure of prior arts, because a photosensitive member is disposed on a substrate, and a light source is usually electrically connected to the photosensitive member disposed on the substrate in a plugging manner, the overall size and thickness of the product cannot be reduced and thinned.

In this embodiment, the photosensitive member 170 and the light source chip 180 are respectively disposed in the first concave part 102 and the second concave part 104 to integrate the light source chip 180 in an identical optical component packaging structure 10*o*. That is, the substrate 100 is used to directly wrap rear and lateral sides of the photosensitive member 170 and the light source chip 180 and expose front sides of the photosensitive member 170 and the light source chip 180. In such manner, the thickness of the optical component packaging structure 10*o* can be the same as the thickness of the substrate 100. Since the photosensitive member 170 and the light source chip 180 are respectively disposed in the first concave part 102 and the second concave part 104, the overall thickness of the optical component packaging structure 10*o* is not influenced and maintains within 0.3 mm or less, such that thinning is achieved and the problems present in the prior art are overcome.

Seventeenth Embodiment

Figure 17A:
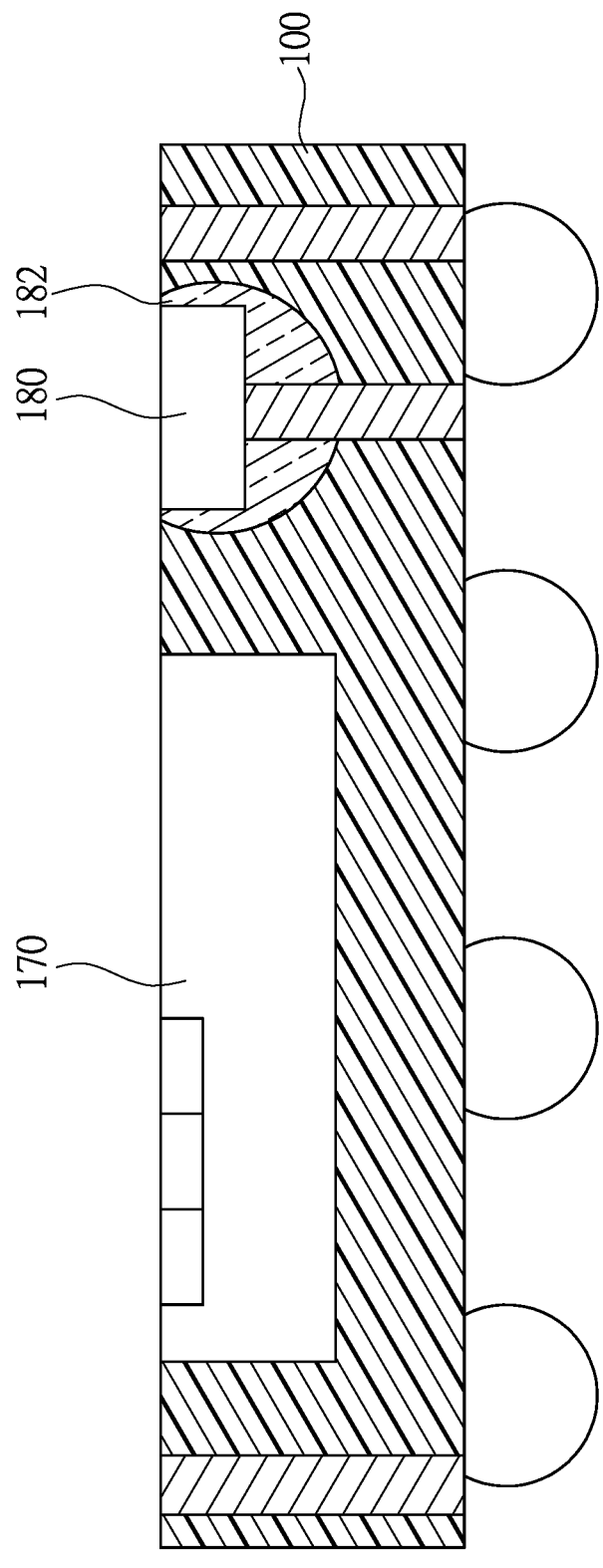
FIG. 17A shows a side view of an optical component packaging structure of a seventeenth embodiment in the instant disclosure.
Figure 17B:
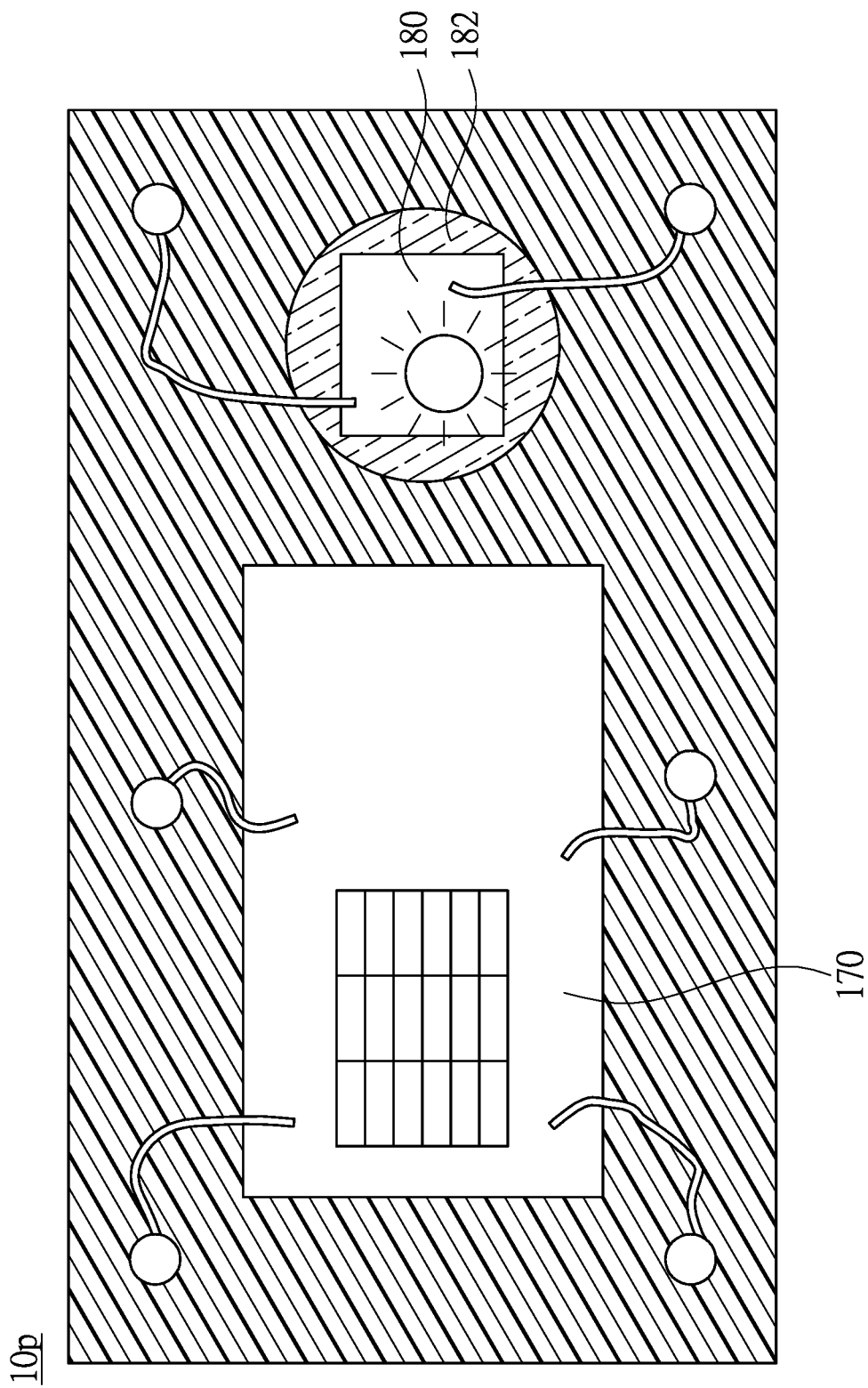
FIG. 17B shows a top view of an optical component packaging structure of the seventeenth embodiment in the instant disclosure.

Referring to FIG. 17A and FIG. 17B, FIG. 17A shows a side view of an optical component packaging structure of a seventeenth embodiment in the instant disclosure, and FIG. 17B shows a top view of an optical component packaging structure of the seventeenth embodiment in the instant disclosure. An optical component packaging structure 10*p* of the seventeenth embodiment in the instant disclosure is similar to the optical component packaging structure 10*o* of the sixteenth embodiment in the instant disclosure, except that the optical component packaging structure 10*p* of the seventeenth embodiment further includes a light transmission structure 182 which is made of a translucent material such as glass or plastic, or may be other substrates having a better light transmittance, so as to clad the light source chip 180.

Eighteenth Embodiment

Figure 18A:
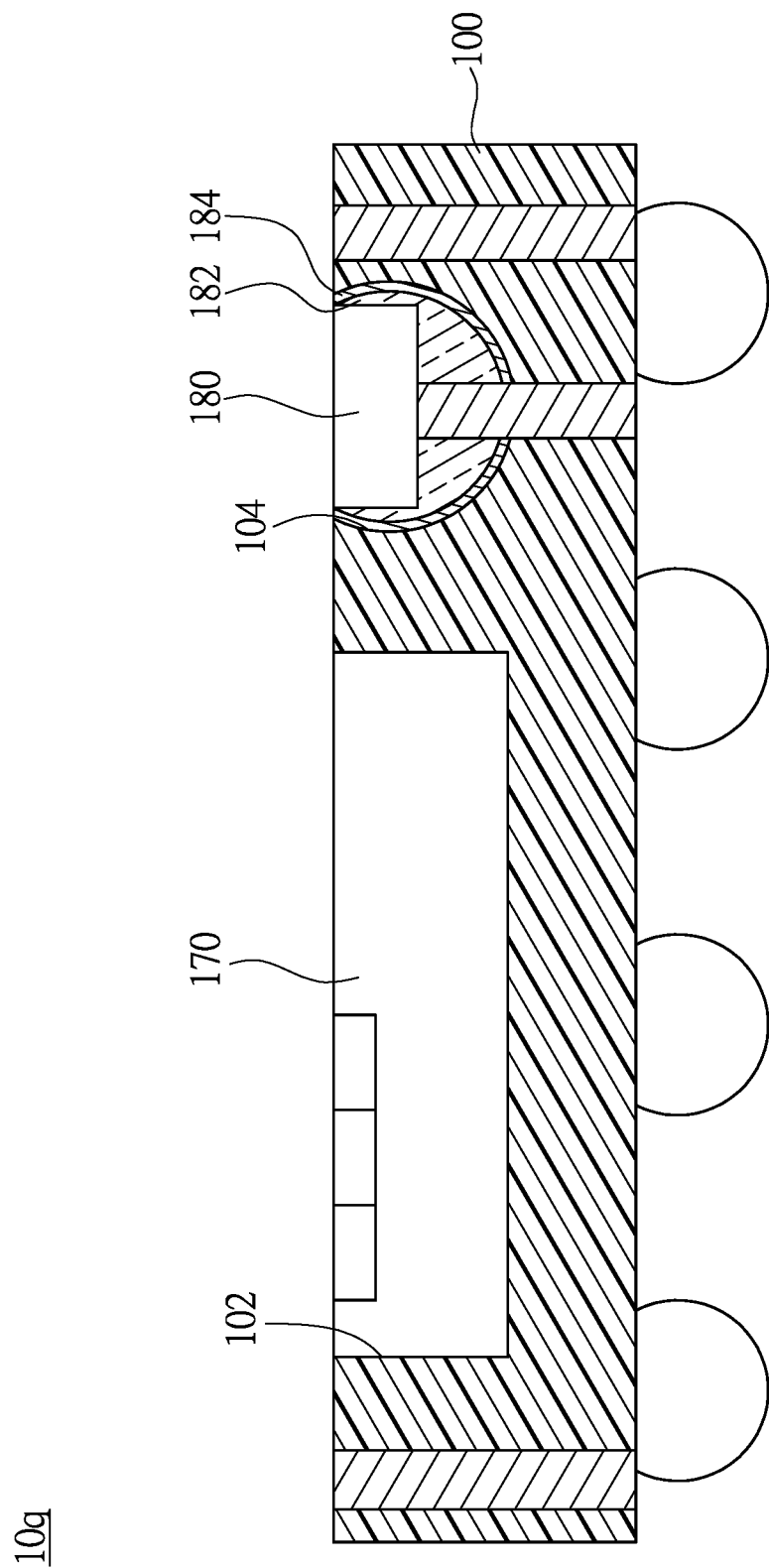
FIG. 18A shows a side view of an optical component packaging structure of an eighteenth embodiment in the instant disclosure.
Figure 18B:
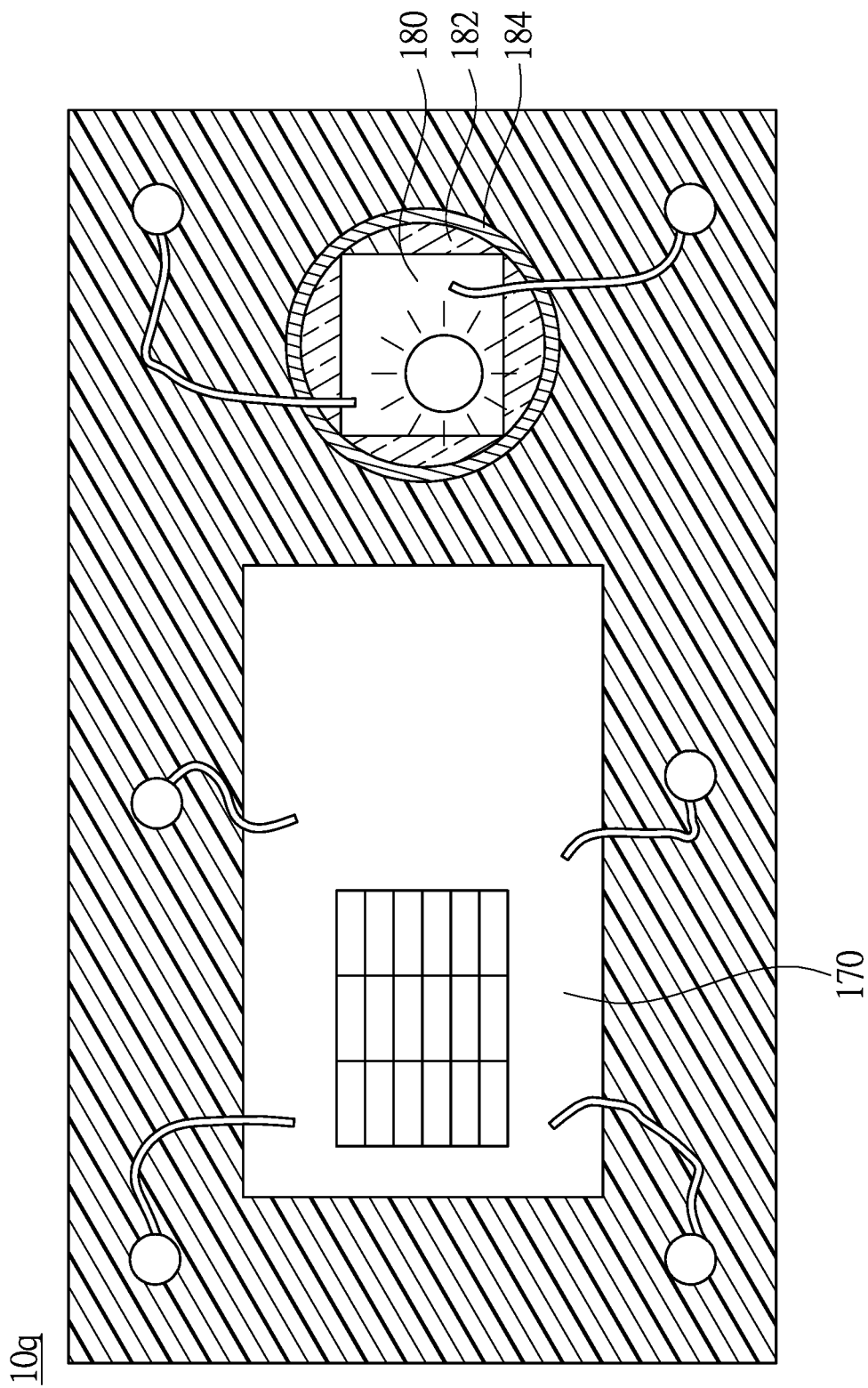
FIG. 18B shows a top view of an optical component packaging structure of an eighteenth embodiment in the instant disclosure.

Referring to FIG. 18A and FIG. 18B, FIG. 18A shows a side view of an optical component packaging structure of an eighteenth embodiment in the instant disclosure, and FIG. 18B shows a top view of an optical component packaging structure of an eighteenth embodiment in the instant disclosure. An optical component packaging structure 10*q* of the eighteenth embodiment in the instant disclosure is similar to the optical component packaging structure 10*p* of the seventeenth embodiment in the instant disclosure, except that the optical component packaging structure 10*q* of the eighteenth embodiment further includes a light reflective structure 184 which clads the light transmission structure 182 and is disposed in the second concave part 104. Specifically, the light reflective structure 184 is made of a metal material such as aluminum, silver, gold and copper.

The optical component packaging structure 10*q* of the eighteenth embodiment has the abovementioned effects of the seventeenth embodiment, and in addition, since the light reflective structure 184 made of a metal material has a mirror effect in the eighteenth embodiment, when the light reflective structure 184 further clads the light transmission structure 182 which is already cladded with the light source chip 180, the light source of the light source chip 180 can emit light more efficiently.

Benefits of Embodiments

In summary, the instant disclosure has the benefits that, the stability of electronic components can be increased by balancing the temperature in the optical component packaging structure, such that the optical component packaging structure of the instant disclosure can perform a superior SNR to further increase the measurement accuracy of sensor chips. In addition, since the optical component packaging structure of the instant disclosure has a packaging structure with a smaller size than previous products, it can achieve the thinning requirement of packaging size, thus reducing production costs.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. An optical component packaging structure, comprising:
    a substrate;
    a far-infrared sensor chip disposed on the substrate and electrically connected to the substrate;
    a metal covering member disposed on the substrate and accommodating the far-infrared sensor chip, the metal covering member having an opening exposing the far-infrared sensor chip, wherein the metal covering member is a metal covering cap; and
    a light transmission member disposed out of the opening and on the inner surface for covering the opening to filter the far-infrared light passing through, wherein the far-infrared sensor chip is only surrounded by the metal covering member, the substrate and the light transmission member, and the metal covering member is directly connected with the substrate.

2. The optical component packaging structure as claimed in claim 1, wherein the far-infrared sensor chip is selected from a group consisting of thermopile, pyroelectric element and thermosensitive element.

3. The optical component packaging structure as claimed in claim 1, wherein the metal covering member further includes a light transmission member disposed at the opening.

* * * * *